(12) United States Patent
Watanuki et al.

(10) Patent No.: US 10,895,681 B2
(45) Date of Patent: Jan. 19, 2021

(54) SEMICONDUCTOR MODULE, MANUFACTURING METHOD THEREOF, AND COMMUNICATION METHOD USING THE SAME

(71) Applicant: RENESAS ELECTRONICS CORPORATION, Tokyo (JP)

(72) Inventors: Shinichi Watanuki, Ibaraki (JP); Yasutaka Nakashiba, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/411,993

(22) Filed: May 14, 2019

(65) Prior Publication Data
US 2019/0391327 A1    Dec. 26, 2019

(30) Foreign Application Priority Data
Jun. 20, 2018   (JP) .................................. 2018-117329

(51) Int. Cl.
*G02B 6/12*  (2006.01)
*H01L 25/16*  (2006.01)
*G02F 1/025*  (2006.01)

(52) U.S. Cl.
CPC ............... *G02B 6/12* (2013.01); *G02F 1/025* (2013.01); *H01L 25/167* (2013.01)

(58) Field of Classification Search
None
See application file for complete search history.

(56) References Cited

U.S. PATENT DOCUMENTS

2017/0031094 A1*   2/2017   Nakashiba .............. G02F 1/025

OTHER PUBLICATIONS

Kazuhiko Kurata, "Opt-Electronics Packaging Technology for Silicon Photonics", the Institute of Electronics, Information and Communication Engineers, Journal C, vol. J98-C No. 3, pp. 36-44.

* cited by examiner

*Primary Examiner* — Jerry Rahll
(74) *Attorney, Agent, or Firm* — McDermott Will & Emery LLP

(57) ABSTRACT

The semiconductor device has an optical waveguide formed on a substrate, a first conductor film formed in the same layer as the optical waveguide, an insulating film formed on the first conductor film, a second conductor film formed on the insulating film, and a first interlayer insulating film formed on the substrate so as to cover the optical waveguide and the second conductor film. The semiconductor device includes a first contact hole reaching the first conductor film, a second contact hole reaching the second conductor film, a first contact plug formed in the first contact hole, and a second contact plug formed in the second contact hole. The first conductor film is disposed between the first contact plugs and the board, but the second conductor film is not disposed between the first contact plugs and the board.

19 Claims, 16 Drawing Sheets

US 10,895,681 B2

SEMICONDUCTOR MODULE, MANUFACTURING METHOD THEREOF, AND COMMUNICATION METHOD USING THE SAME

CROSS-REFERENCE TO RELATED APPLICATIONS

The disclosure of Japanese Patent Application No. 2018-117329 filed on Jun. 20, 2018 including the specification, drawings and abstract is incorporated herein by reference in its entirety.

BACKGROUND

The present invention relates to a semiconductor device, and can be suitably applied to, for example, a semiconductor device having an optical device in a semiconductor chip.

In recent years, so-called silicon photonics technology has been actively developed in which an optical waveguide (transmission line for optical signal) made of silicon (Si) is formed on a part of a semiconductor substrate, and an optical device and an electronic device composed of the optical waveguide are integrated to realize a semiconductor substrate as an optical communication module.

In silicon photonics technology, noise countermeasures are indispensable in order to stably operate an IC chip such as a driver IC for driving an optical modulator in an electronic circuit. Conventionally, it is known to dispose a capacitor (chip capacitor) for blocking noise between a power supply and a ground (GND) in order to cope with such noise. For example, Journal C Vol. J98-C No. 3 pp. 36-44 of the Institute of Electronics, Information and Communication Engineers describes a semiconductor device in which a driver IC and a chip capacitor for the driver IC are mounted on a silicon photonics chip.

SUMMARY

The inventors of the present application have studied measures against noise in a semiconductor device including a semiconductor substrate on which an optical waveguide is formed.

It is desired to improve the performance of the semiconductor device by devising the configuration of the semiconductor device.

Other objects and novel features will become apparent from the description of this specification and the accompanying drawings.

A semiconductor device according to an embodiment includes a substrate, an optical waveguide formed on the substrate, a first conductor film formed in the same layer as the optical waveguide, an insulating film formed on the first conductor film, a second conductor film formed on the insulating film, and a first interlayer insulating film formed on the substrate so as to cover the optical waveguide and the second conductor film. The semiconductor device includes a first contact hole reaching the first conductor film, a second contact hole reaching the second conductor film, a first contact plug formed in the first contact hole, and a second contact plug formed in the second contact hole. The first conductor film is disposed between the first contact plug and the substrate, but the second conductor film is not disposed between the first contact plug and the substrate.

According to one embodiment, the performance of the semiconductor device can be improved.

DETAILED DESCRIPTION

Figure 1:
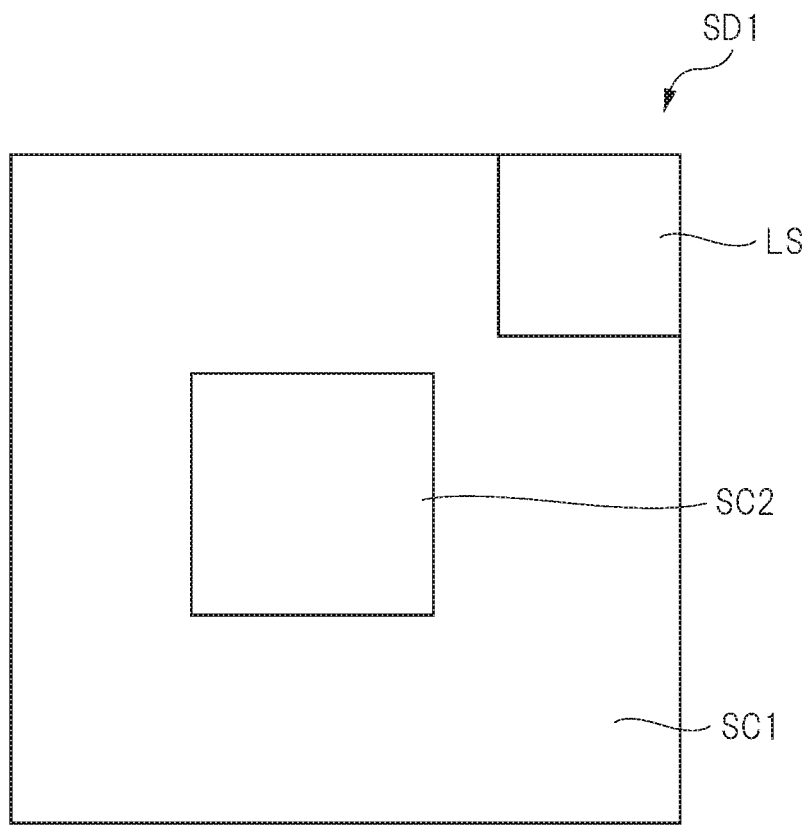
FIG. 1 is a plan view of a semiconductor device according to a first embodiment.

In the present application, descriptions of embodiments will be divided into a plurality of sections or the like for convenience of description, if necessary, except where expressly stated otherwise, these are not independent from each other, and each part of a single example, one of which is a partial detail or a part or all of the other, whether before or after the description. In principle, descriptions of similar parts are omitted. Also, each component in an embodiment is not essential, unless expressly stated otherwise, theoretically limited to that number, and obviously otherwise from the context.

Similarly, in the description of the embodiment and the like, "X consisting of A" the like with respect to the material, composition, and the like does not exclude elements other than A, except when it is clearly indicated that this is not the case and when it is obvious from the context that this is not the case. For example, with respect to a component, it means "X including A as a main component" or the like. For example, a "silicon member" or the like is not limited to pure silicon, and it is needless to say that a member including a SiGe (silicon-germanium) alloy, a multi-element alloy containing silicon as its main component, other additives, or the like is also included. In addition, the term gold plating, Cu layer, nickel plating, or the like includes not only pure materials, but also members containing gold, Cu, nickel, or the like as main components, except when it is clearly stated that this is not the case.

In addition, reference to a specific numerical value or quantity may be greater than or less than that specific numerical value, unless expressly stated otherwise, theoretically limited to that number, and obviously not so from the context.

In the drawings of the embodiments, the same or similar parts are denoted by the same or similar symbols or reference numerals, and the description will not be repeated in principle.

In addition, in the attached drawings, hatching and the like may be omitted even in a cross-section when it becomes complicated or when it is clearly distinguished from a gap. In this connection, even if the hole is closed in plan, the outline of the background may be omitted when it is obvious from the description or the like. In addition, hatching may be used to indicate that it is not a void, even if it is not a cross-section.

First Embodiment

<Configuration of a Semiconductor Device>

Figure 2:
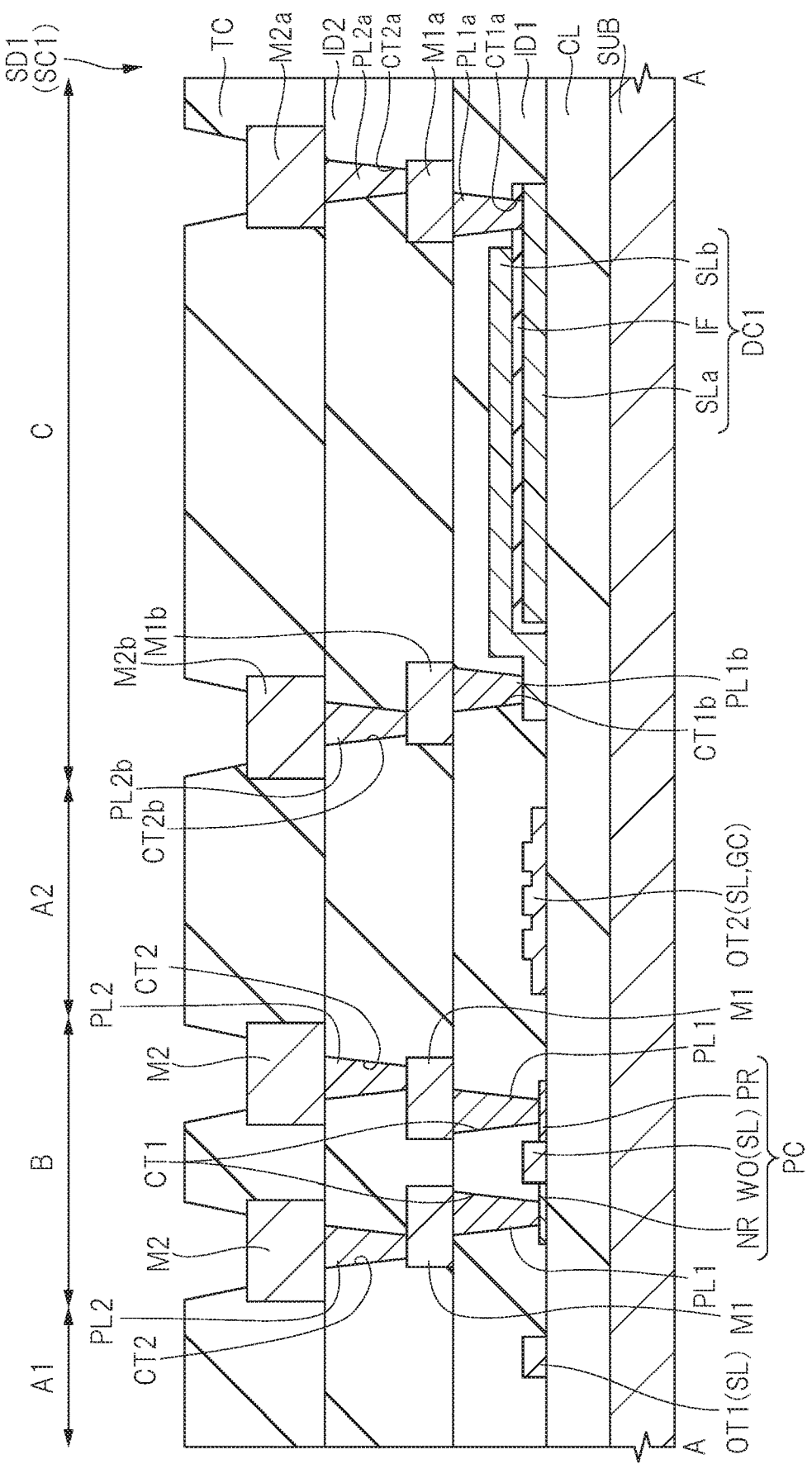
FIG. 2 is a cross-sectional view of a main portion of a semiconductor device according to a first embodiment.
Figure 3:
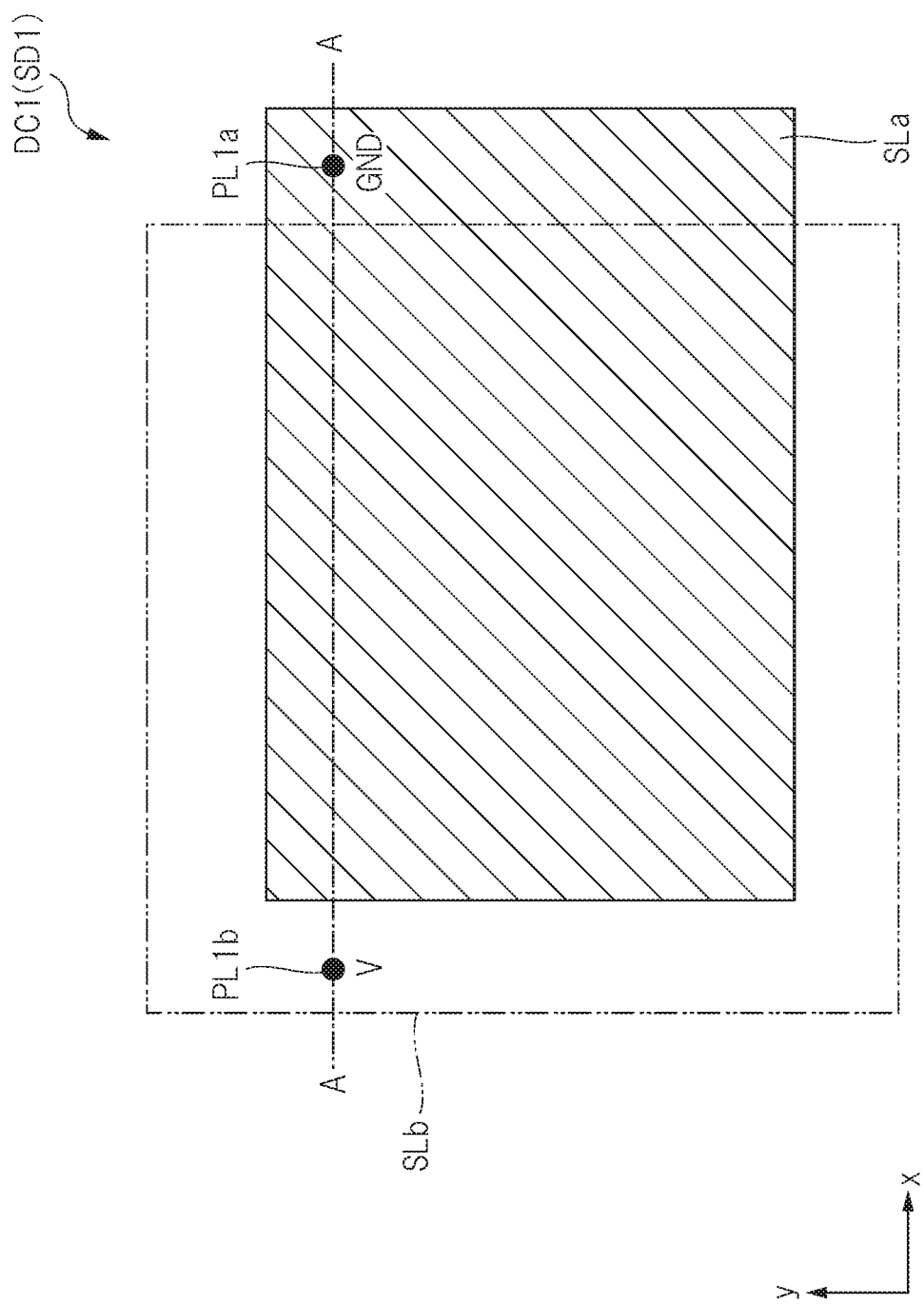
FIG. 3 is a plan view of a main portion of a semiconductor device according to a first embodiment.

A configuration of a semiconductor device according to a first embodiment will be described with reference to FIGS. 1 to 3. FIG. 1 is a plan view of a semiconductor device SD1 according to the first embodiment. FIG. 2 is a cross-sectional view of a main portion of the semiconductor device SD1 according to the first embodiment. FIG. 3 is a plan view of a main portion of the semiconductor device SD1 according to the first embodiment.

As shown in FIG. 1, the semiconductor device SD1 according to the first embodiment includes a semiconductor chip SC1, a light source LS mounted on the semiconductor chip SC1, and a semiconductor chip SC2 mounted on the semiconductor chip SC1. The semiconductor chip SC1 includes optical waveguides (transmission lines for optical signals) OT1 and OT2, an optical modulator PC, and a capacitor DC1, which will be described later. The semiconductor chip SC2 has a driver IC for driving the optical modulator PC. The light source LS is, for example, a laser diode.

Hereinafter, structures of optical devices integrated on Silicon on Insulator (SOI) substrate will be described using the semiconductor chip SC1 as an example. Hereinafter, an optical waveguide and an optical modulator of the optical devices will be described as an example.

As shown in FIG. 2, the semiconductor chip SC1 according to the first embodiment includes a substrate SUB, an insulating layer CL formed on the substrate SUB, and a semiconductor layer SL formed on the insulating layer CL. The substrate SUB, the insulating layer CL, and the semiconductor layer SL constitute a semiconductor substrate as the SOI substrate.

The substrate SUB is made of, for example, a p-type silicon (Si) single crystal substrate having a plane orientation of (100) and a resistivity of about 5 to 50 Ωcm. The insulating layer CL is also referred to as a Buried Oxide (BOX) layer or a lower cladding layer, and the insulating layer CL is made of, for example, a silicon oxide ($SiO_2$) film. The semiconductor layer SL is also referred to as an SOI layer or a core layer, and is made of, for example, a polycrystalline silicon film or a single crystal silicon film. The SOI substrate can be formed by, for example, a Separation by implantation of Oxygen (SIMOX) method, a bonding method, a Smart Cut method, or the like. The thickness of the substrate SUB is, for example, about 750 µm. The thickness of the insulating layer CL is, for example, about 2 to 3 µm. The thickness of the semiconductor layer SL is, for example, about 180 to 250 nm. Hereinafter, in the cross-sectional view, the thickness dimension of the semiconductor layer SL is exaggerated for easy understanding.

The structures of the optical waveguides OT1 and OT2, the optical modulator PC, and the capacitor DC1 will be described below.

As shown in FIG. 2, optical waveguides (transmission lines for optical signals) are formed in the regions A1 and A2 of the semiconductor chip SC1. The optical waveguides include an optical waveguide (first optical waveguide) OT1 formed in the region A1 of the semiconductor chip SC1 and an optical waveguide (second optical waveguide) OT2 formed in the region A2 of the semiconductor chip SC1. The optical waveguides OT1 and OT2 are formed in the same layer.

Since the light propagating in the optical waveguide propagates while seeping out to some extent to the outside of the optical waveguide, if the distance between the optical waveguides is too short, there is a possibility that the light may interfere with each other. Therefore, a sufficient amount of an interlayer insulating film is disposed around one optical waveguide, and in plan view, the area occupied by the optical waveguides OT1 and OT2 with respect to the semiconductor chip SC1 is low, which is about 5 to 10% in total with an optical modulator or the like to be described later.

The optical waveguide OT1 is formed of the semiconductor layer SL, and has a rectangular cross section orthogonal to the traveling direction of the optical signal. The height of the optical waveguide OT1 is, for example, 200 to 300 nm. The width of the optical waveguide OT1 in a cross section perpendicular to the traveling direction of the optical signal is, for example, 300 to 500 nm.

The optical waveguide OT2 constitutes a grating coupler GC. The grating coupler is an element for extracting light propagating in the optical waveguide or coupling laser light from the outside to light propagating in the optical waveguide. The thickness of the optical waveguide OT2 is, for example, about 200 to 300 nm in a thick portion and about 100 nm in a thin portion.

An interlayer insulating film (first interlayer insulating film, upper cladding layer) ID1 is formed on the insulating layer CL so as to cover the optical waveguides OT1 and OT2. An interlayer insulating film (second interlayer insulating film) ID2 is formed on the interlayer insulating film ID1. The interlayer insulating films ID1 and ID2 are made of, for example, silicon oxide ($SiO_2$) films. The thickness of each of the interlayer insulating films ID1 and ID2 is, for example, 2 to 3 µm. A protective film TC is formed on the interlayer insulating film ID2. The protective film TC is made of, for example, a silicon oxide film or a silicon oxynitride (SiON) film. When the optical waveguide OT2 inputs/outputs an optical signal to/from the outside, the protective film TC may not be formed above the optical waveguide OT2.

In the first embodiment, the case where the optical waveguides OT1 and OT2 are formed has been described as an example, but the present invention is not limited thereto.

As shown in FIG. 2, an optical modulator PC is formed in a region B of the semiconductor chip SC1. The optical modulator PC includes, for example, a p-type semiconductor layer PR, an i (intrinsic) type optical waveguide WO (semiconductor layer SL), and an n-type semiconductor layer NR. The optical waveguides WO are formed in the same layer as the optical waveguides OT1 and 2. The optical waveguide WO is thicker than the semiconductor layers PR and NR. The optical waveguide WO is composed of a semiconductor layer SL which is an intrinsic semiconductor, i.e., an i-type semiconductor. The semiconductor layer PR is formed by introducing a p-type impurity into a portion of the semiconductor layer SL. The semiconductor layer NR is formed by introducing an n-type impurity into a part of the semiconductor layer SL. The thickness of the optical waveguide WO is, for example, 200 to 300 nm. The thickness of the semiconductor layer PR and the thickness of the semiconductor layer NR are, for example, about 50 nm.

An electrode (contact plug PL1 (described later)) is connected with each of the semiconductor layer PR and the semiconductor layer NR. The voltage applied to these electrodes changes the carrier density in the optical waveguide WO and changes the refractive index of that region. By doing so, the effective refractive index for the light propagating in the optical modulator PC changes, and the phase of the light output from the optical modulator PC can be changed.

The optical modulator PC is covered with an interlayer insulating film ID1. A wiring M1 is formed on the upper surface of the interlayer insulating film ID1. The wiring M1 is made of, for example, a material containing aluminum (Al) or copper (Cu) as a main component. Contact holes CT1 reaching the semiconductor layer PR and the semiconductor layer NR are formed in the interlayer insulating film ID1. The contact plug PL1 is buried in the contact hole CT1. The semiconductor layer PR and the semiconductor layer NR are electrically connected with the wiring M1 via the contact plug PL1, respectively.

The wiring M1 is covered with the interlayer insulating film ID2. A wiring M2 is formed on the upper surface of the interlayer insulating film ID2. A contact hole CT2 reaching the wiring M1 is formed in the interlayer insulating film ID2. The contact plug PL2 is buried in the contact hole CT2. The wiring M2 is electrically connected with the wiring M1 via the contact plug PL2. The wiring M2 is covered with a protective film TC, a portion of which is open and the top surface of the wiring M2 is exposed.

The contact plugs PL1 and PL2 are made of, for example, a material containing tungsten (W) as a main component. The wiring M1 and the wiring M2 are made of, for example, a material containing aluminum (Al) or copper (Cu) as a main component.

[Capacitor]

The capacitor DC1 formed in the semiconductor chip SC1 according to the first embodiment will be described. First, the cross-sectional structure of the capacitor DC1 will be described in detail. FIG. 2 corresponds to a cross-sectional view taken along line A-A of FIG. 3, which will be described later.

As shown in FIG. 2, a capacitor DC1 is formed in a region C of the semiconductor chip SC1. The capacitor DC1 includes an n-type semiconductor layer (first conductor film) SLa, an insulating film IF, and an n-type semiconductor layer (second conductor film) SLb. The insulating film IF is formed of, for example, a silicon oxide film, a silicon nitride film, or a stacked film of these films. The semiconductor layer SLa is formed, for example, by introducing an n-type impurity such as phosphorus (P) or arsenic (As) into the semiconductor layer SL. The semiconductor layer SLb is formed, for example, by introducing an n-type impurity into the polycrystalline silicon film, after the polycrystalline silicon film is formed, or by forming a semiconductor film (doped silicon film) formed of a polycrystalline silicon film containing an n-type impurity. From the standpoint of obtaining high conductivity, the impurity concentrations of the semiconductor layer SLa and the semiconductor layer SLb are preferably both high, for example, $1 \times 10^{18}$ cm$^{-3}$ or more, more preferably $1 \times 10^{19}$ cm$^{-3}$ or more. The thickness of the semiconductor layers SLa and SLb is, for example, 200 to 300 nm. The thickness of the insulating film IF is preferably as thin as possible, for example, 10 to 50 nm within a range in which the electrostatic breakdown voltage between the semiconductor layer SLa and the semiconductor layer SLb can be secured.

The capacitor DC1 is covered with the interlayer insulating film ID1. Wirings M1a and M1b are formed on the upper surface of the interlayer insulating film ID1. In the interlayer insulating film ID1, a contact hole CT1a reaching the semiconductor layer SLa and a contact hole CT1b reaching the semiconductor layer SLb are formed. Contact plugs PL1a are buried in the contact holes CT1a. Contact plugs PL1b are buried in the contact holes CT1b.

In the capacitor DC1, the insulating film IF is formed on the semiconductor layer SLa, and the semiconductor layer SLb is formed on the insulating layer IF, thereby forming a multilayer structure of the semiconductor layer SLa, the insulating film IF, and the semiconductor layer SLb. The semiconductor layer SLa is electrically connected with the interconnection M1a through the first contact plug PL1a. The semiconductor layer SLb is electrically connected with the wiring M1b via a contact plug (second contact plug) PL1b.

Therefore, the semiconductor layer SLa is disposed between the contact plugs PL1a and the insulating layer CL, but the semiconductor layer SLb is not disposed between the contact plugs PL1a and the insulating layer CL. The semiconductor layer SLb is disposed between the contact plugs PL1b and the insulating layer CL, but the semiconductor layer SLa is not disposed between the contact plugs PL1b and the insulating layer CL.

The wirings M1a and M1b are covered with the interlayer insulating film ID2. Wirings M2a and M2b are formed on the upper surface of the interlayer insulating film ID2. A contact hole CT2a reaching the wiring M1a and a contact hole CT2b reaching the wiring M1b are formed in the interlayer insulating film ID2. Contact plugs PL2a are buried in the contact holes CT2a. Contact plugs PL2b are buried in the contact holes CT2b. The wiring M2a is electrically connected with the wiring M1a through the contact plugs PL2a. The wiring M2b is electrically connected with the wiring M1b through the contact plugs PL2b. The wiring M2a is connected with, for example, a ground potential, and the wiring M2b is connected with, for example, a power supply potential.

The contact plugs PL1a, PL1b, PL2a, PL2b are made of, for example, tungsten (W) as a main component. The wirings M1a and M1b and the wirings M2a and M2b are made of, for example, a material containing aluminum (Al) or copper (Cu) as a main component.

The wiring M2a and M2b are covered with the protective film TC, a portion of which is open and the top surfaces of the wiring M2a and M2b are exposed.

Next, the planar structure of the capacitor DC1 will be described in detail. FIG. 3 is an example of a main portion plan view showing an enlarged region C of the semiconductor chip SC1 shown in FIG. 2. In FIG. 3, in order to simplify understanding, the semiconductor layer SLb is represented by a two-dot chain line, and the semiconductor layer SLa overlapping the semiconductor layer SLb in plan view is represented by a perspective view.

As shown in FIG. 3, the semiconductor layer SLa has a rectangular pattern with long sides and short sides of, for example, 5 to 200 μm in plan view. On the other hand, the semiconductor layer SLb is formed so that a part thereof overlaps with the semiconductor layer SLa in plan view. The semiconductor layer SLb is a square pattern having a side of, for example, 5 to 200 μm in plan view.

As described above, the semiconductor layer SLa is in contact with the contact plug PL1a, and the semiconductor layer SLb is in contact with the contact plug PL1b. In plan view, the semiconductor layer SLa and the semiconductor layer SLb do not overlap each other in regions where the semiconductor layer SLa and the contact plugs PL1a are in contact with each other. In plan view, the semiconductor layer SLa and the semiconductor layer SLb do not overlap each other in regions where the semiconductor layer SLb and the contact plugs PL1b are in contact with each other.

As described above, the contact plug PL1a is electrically connected with the wiring M2a, and the contact plug PL1b is electrically connected with the wiring M2b. Therefore, the wiring M2a is connected with the ground potential, for example, so that the ground potential GND in FIG. 3 is supplied to the semiconductor layer SLa. Similarly, the wiring M2b is connected with the power supply potential, for example, so that the power supply potential V in FIG. 3 is supplied to the semiconductor layer SLb.

The plane shape of the semiconductor layer SLa is not limited to a rectangle, and the planar shape of the semiconductor layer SLb is not limited to a square.

A manufacturing method of the semiconductor device SD1 according to the first embodiment will be described in order of steps with reference to FIGS. 4 to 8. FIGS. 4 to 8 are cross-sectional views of main portions during the manufacturing step of the semiconductor device SD1 according to the first embodiment. In order to simplify the understanding, only the region C of the semiconductor chip SC1 shown in FIG. 2 is shown in FIGS. 4 to 8.

Figure 4:
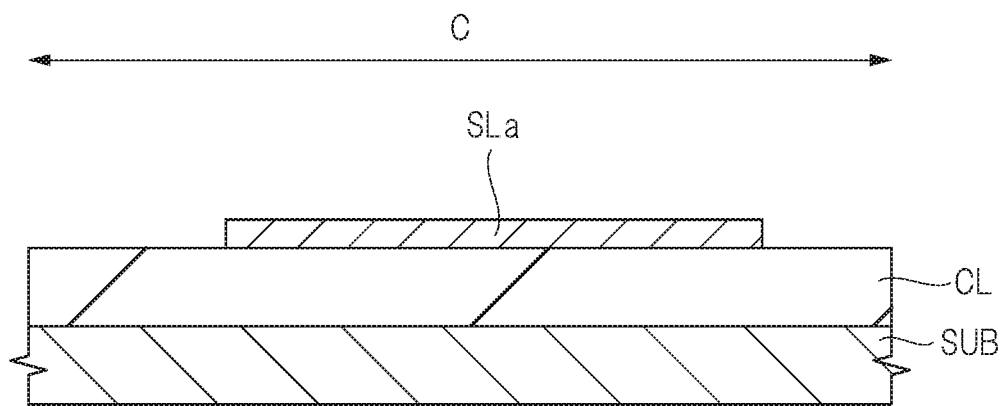
FIG. 4 is a cross-sectional view of a main portion illustrating a manufacturing step of a semiconductor device according to a first embodiment.

First, as shown in FIG. 4, an SOI substrate composed of a substrate SUB, an insulating layer CL, and a semiconductor layer is prepared. The SOI substrate is an SOI wafer having a substantially circular planar shape. Next, the semiconductor layer made of silicon is patterned by dry etching using, for example, a photoresist film (not shown) formed on the semiconductor layer as a mask. Thereafter, an n-type impurity is introduced into the semiconductor layer by an ion implantation method using a photoresist film (not shown) as a mask, whereby a semiconductor layer SLa is formed in a part of the SOI substrate.

Figure 5:
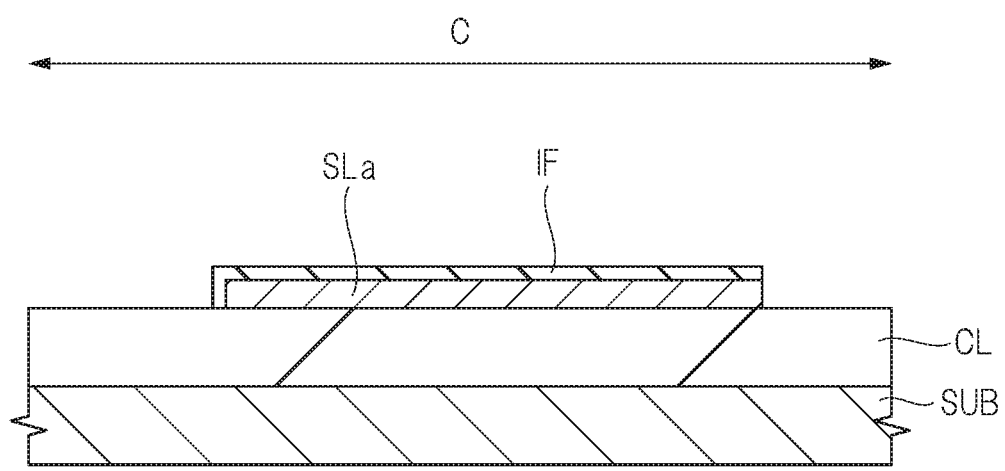
FIG. 5 is a cross-sectional view of a main portion illustrating a manufacturing step of a semiconductor device after the step in FIG. 4.

Next, as shown in FIG. 5, an insulating film IF formed of a silicon oxide film is formed on the insulating layer CL by, e.g., Chemical Vapor Deposition (CVD) so as to cover the semiconductor layer SLa.

Figure 6:
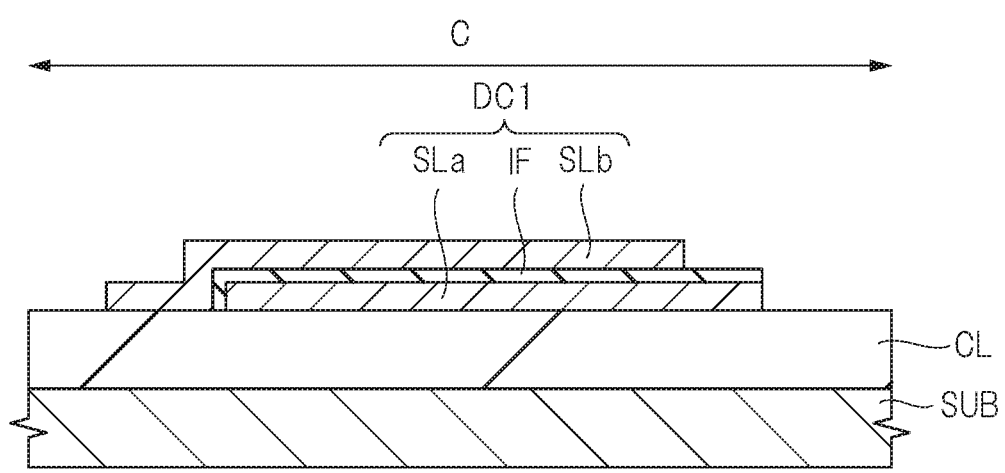
FIG. 6 is a cross-sectional view of a main portion illustrating a manufacturing step of a semiconductor device after the step in FIG. 5.

Next, as shown in FIG. 6, a semiconductor layer SLb formed of a polycrystalline silicon film containing an n-type impurity is formed on the insulating layer CL by, e.g., CVD so as to cover the insulating film IF. Thus, a capacitor DC1 composed of an n-type semiconductor layer (first conductor film) SLa, an insulating film IF, and an n-type semiconductor layer (second conductor film) SLb is formed.

Figure 7:
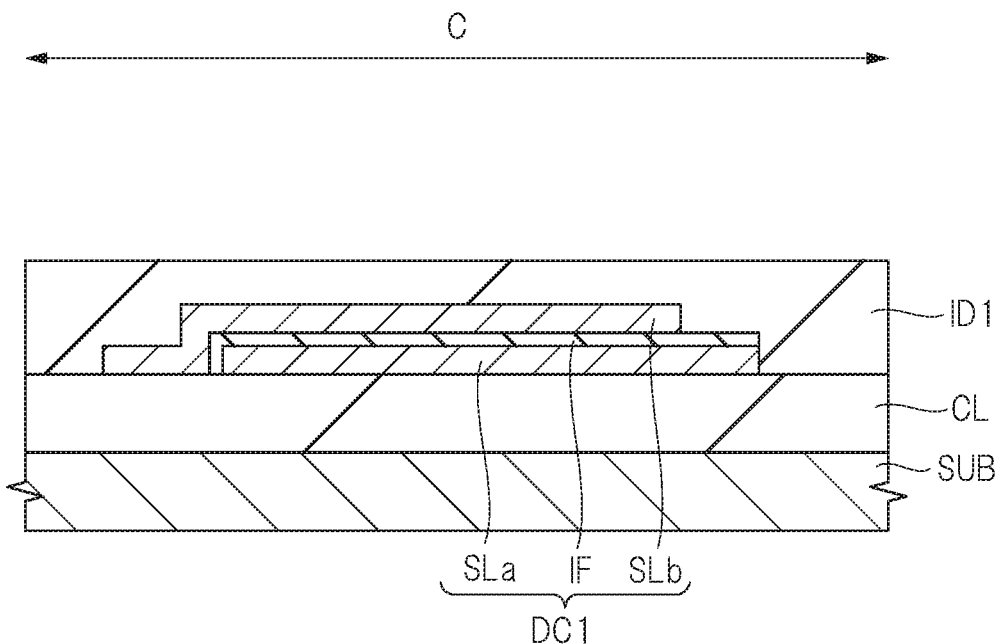
FIG. 7 is a cross-sectional view of a main portion illustrating a manufacturing step of a semiconductor device after the step in FIG. 6.

Next, as shown in FIG. 7, an interlayer insulating film ID1 made of a silicon oxide film, is deposited on the insulating layer CL so as to cover the capacitor DC1 by, e.g., CVD. Thereafter, the upper surface of the interlayer insulating film ID1 is flattened by, e.g., chemical mechanical polishing (CMP).

Figure 8:
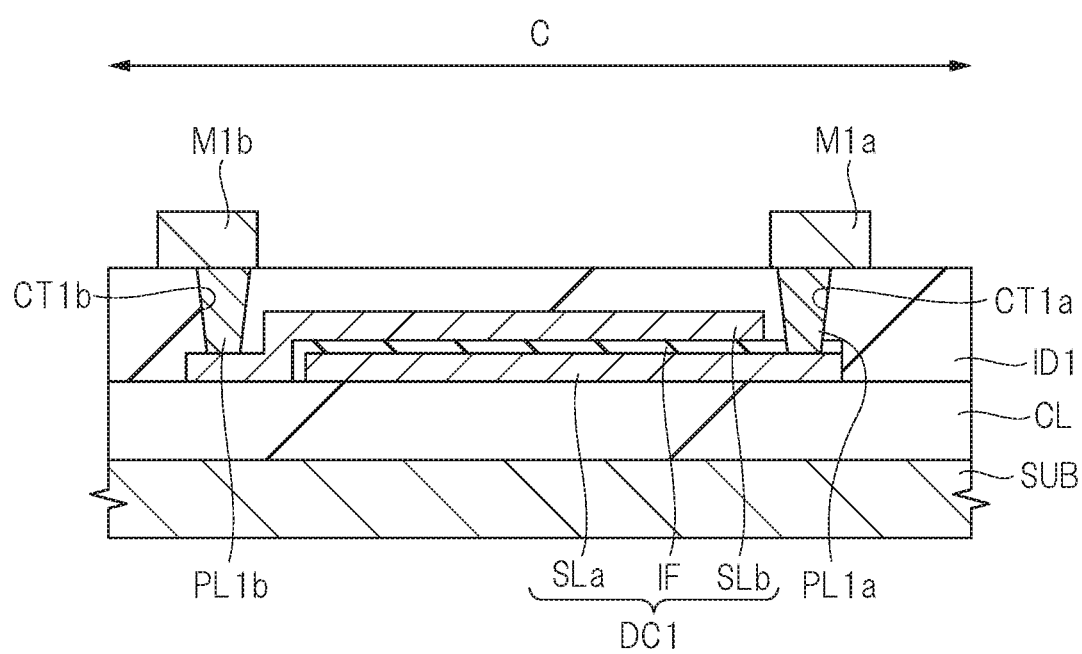
FIG. 8 is a cross-sectional view of a main portion illustrating a manufacturing step of a semiconductor device after the step in FIG. 7.

Next, as shown in FIG. 8, a contact hole CT1a reaching the semiconductor layer SLa and a contact hole CT1b reaching the semiconductor layer SLb are formed in the interlayer insulating film ID1 and the insulating film IF. Then, a tungsten film, for example, is buried in each of the contact holes CT1a, CT1b to form contact plugs PL1a, PL1b. Thereafter, an aluminum film is deposited on the upper surface of the interlayer insulating film ID1 by, e.g., sputtering. The aluminum film is processed by, e.g., dry etching to form wirings M1a and M1b.

Although not particularly illustrated in FIG. 8 and subsequent figures, the first embodiment has a step of forming an interlayer insulating film ID2 on the interlayer insulating film ID1 so as to cover the wirings M1a and M1b. Thereafter, the first embodiment includes a step of forming the contact holes CT2a, CT2b reaching the wirings M1a and M1b in the interlayer insulating film ID2, and a step of forming the contact plugs PL2a, PL2b inside the contact holes CT2a, CT2b. The first embodiment includes a step of forming the wirings M2a and M2b on the interlayer insulating film ID2 and a step of forming the protective film TC. Through the above steps, the semiconductor chip SC1 of the first embodiment is completed.

Thereafter, as shown in FIG. 1, the light source LS and the semiconductor chip SC2 are mounted on the semiconductor chip SC1. Here, of the external terminals of the semiconductor chip SC2, a terminal for supplying the ground potential to the driver IC is electrically connected with the wiring M2a of the semiconductor chip SC1 shown in FIG. 2, and a terminal for supplying the power supply potential to the driver IC is electrically connected with the wiring M2b of the semiconductor chip SC1 shown in FIG. 2. Among the external terminals of the semiconductor chip SC2, a terminal for supplying a potential for driving the optical modulator PC is electrically connected with the wiring M2 of the semiconductor chip SC1 shown in FIG. 2. Through the above steps, the semiconductor device SD1 of the first embodiment is completed.

A power supply potential of, for example, 2 to 5 V is supplied to the driver IC for driving the optical modulator PC. Therefore, the potential difference between the semiconductor layer SLa and the semiconductor layer SLb of the capacitor DC1 is, for example, in the range of 2 to 5 V.

Figure 9:
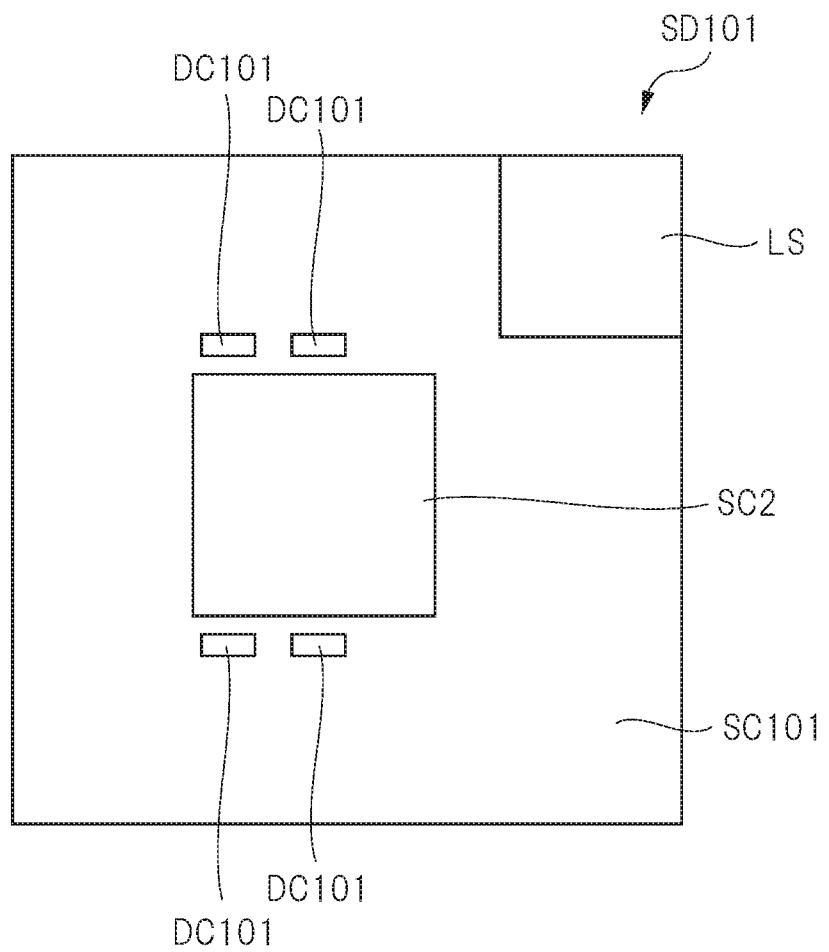
FIG. 9 is a plan view of a semiconductor device according to an example of consideration.

Hereinafter, the configuration of the semiconductor device of the examination example discussed by the inventor of the present application will be described. FIG. 9 is a plan view of the SD101 of the semiconductor device of the considered examples.

As shown in FIG. 9, the semiconductor device SD101 of the considered example includes a semiconductor chip SC101, a light source LS mounted on the semiconductor chip SC101, a semiconductor chip SC2 mounted on the semiconductor chip SC101, and a capacitor DC101 mounted on the semiconductor chip SC101. The capacitor DC101 is a chip capacitor. The semiconductor chip SC101 includes optical waveguides (transmission lines for optical signals) OT1 and OT2 and an optical modulator PC, but does not include the capacitor DC1 according to the first embodiment. The above points are the differences between the semiconductor device SD101 according to the considered example and the semiconductor device SD1 of the first embodiment.

Here, the problem found by the present inventor will be described with respect to the considered example. As described above, in the silicon photonics technology, in order to stably operate an IC chip such as a driver IC on an electronic circuit, a countermeasure against noise is indispensable. Particularly, since the optical signal has a high frequency, noise removal in a high frequency band is required.

Generally, when a capacitor is connected in parallel with the load of the main circuit, it acts as a noise filter circuit. Specifically, as the imaginary unit j, the frequency f, and the capacitance C, the impedance Z of the capacitor is $Z=1/j2\pi fC$. When the impedance Z of the capacitor becomes smaller than the load of the main circuit with respect to the frequency f of the noise, the noise bypasses the capacitor side and does not pass through the main circuit. In this way, the capacitor acts as a noise filter. Such capacitors are called decoupling capacitors (decoupling capacitors, bypass capacitors).

As can be understood from the above equation, since the frequency f that can be filtered depends on the capacitance C of the capacitor, a plurality of types of capacitors having different capacitances are often used in combination in the noise filter depending on the frequency to be filtered. Therefore, although the semiconductor device SD101 of the considered examples has a plurality of capacitors DC101 having different capacitances as decoupling capacitors, as a result, the number of components to be mounted increases and manufacturing costs also increase. In addition, although not shown, a plurality of noise filters composed of combinations of a plurality of capacitors having differing capacitances need to be prepared depending on the number and arrangement of the power supply lines of the semiconductor chips SC101 and SC2. In such a case, the number of components to be mounted further increases, and the manufacturing cost becomes larger and larger.

In addition, the semiconductor device of the considered example has another problem. In the considered example, the semiconductor chip SC2 and the capacitor DC101 are mounted on the semiconductor chip SC101. Therefore, of the external terminals of the semiconductor chip SC2, the terminal for supplying the ground potential to the driver IC and the terminal for supplying the power supply potential to the driver IC are connected with the capacitor DC101 via the wirings in the semiconductor chip SC101.

The wires connecting the semiconductor chip SC2 and the capacitor DC101 are regarded as resistors and inductors connected in series to the capacitors of the noise filter, and these have parasitic resistances and parasitic inductances, respectively. Therefore, as the length of the line connecting the semiconductor chip SC2 and the capacitor DC101 increases, the parasitic resistances and parasitic inductances of the semiconductor chip SC2 increase. Here, the impedance Zp of the capacitor in consideration of the parasitic resistance R and the parasitic inductance L is $Zp=1/j2\pi fC+R+j2\pi fL$. Therefore, if the parasitic resistance R and the parasitic inductance L become increase, the impedance Zp of the capacitor becomes large, and the noise to be filtered cannot be bypassed. Particularly, as the frequency f of the parasitic inductance L increases, the contribution to the impedance Zp increases, so that it becomes difficult to remove the noise in the high-frequency band.

From the above, it is desired to reduce the number of components to be mounted and the manufacturing cost in a silicon photonic device including a capacitor constituting r noise filter. Further, it is desired to shorten the distance between the capacitor constituting the noise filter and the semiconductor chip having the driver IC, thereby enabling noise removal in a high-frequency band.

Hereinafter, main features and effects of the semiconductor device SD1 according to the first embodiment will be described. As shown in FIG. 2, one of the main features of the semiconductor device SD1 according to the first embodiment is that the capacitor DC1 is built in the semiconductor chip SC1 on which the optical waveguide OT1 is formed. That is, the semiconductor layer SLa, the insulating film IF, and the semiconductor layer SLb formed in the interlayer insulating film ID1 of the semiconductor chip SC1 constitute the capacitor DC1.

The insulating film IF is formed on the semiconductor layer SLa, and the semiconductor layer SLb is formed on the insulating layer IF, thereby forming a stacked structure of the semiconductor layer SLa, the insulating film IF, and the semiconductor layer SLb along the thickness direction of the semiconductor chip SC1. The semiconductor layer SLa is disposed between the contact plugs PL1a and the insulating layer CL, but the semiconductor layer SLb is not disposed between the contact plugs PL1a and the insulating layer CL. The semiconductor layer SLb is disposed between the contact plugs PL1b and the insulating layer CL, but the semiconductor layer SLa is not disposed between the contact plugs PL1b and the insulating layer CL. As a result, the semiconductor layer SLa is electrically connected with the interconnection M1a through the contact plugs PL1a. The semiconductor layer SLb is electrically connected with the interconnection M1b through the contact plugs PL1b.

In the first embodiment, the performance of the semiconductor device can be improved by adopting such a configuration. Hereinafter, the reason will be described in detail.

As illustrated in FIG. 2, in the first embodiment, the capacitor DC1 is embedded in the semiconductor chip SC1. Therefore, the capacitor DC101 mounted in the semiconductor device SD101 of the considered example illustrated in FIG. 9 is not required. As a result, in the first embodiment, the number of components to be mounted can be reduced as compared with the considered example, and the manufacturing cost can be suppressed.

In the first embodiment, the insulating film IF is formed on the semiconductor layer SLa, and the semiconductor layer SLb is formed on the insulating layer IF, thereby forming a stacked structure of the semiconductor layer SLa, the insulating film IF, and the semiconductor layer SLb along the thickness direction of the semiconductor chip SC1. Thus, in the parallel plate capacitor DC1 formed of the semiconductor layer SLa and the semiconductor layer SLb, the areas of the semiconductor layers SLa and SLb can be easily widened along the in-plane direction of the semiconductor chip SC1 (substrate SUB), and the distance between the semiconductor layer SLa and the semiconductor layer SLb can be easily narrowed in the thickness direction of the semiconductor chip SC1. That is, in the first embodiment, the capacitor DC1 having a relatively large capacitance can be easily formed in the semiconductor chip SC1.

Particularly, since the semiconductor chip SC1 according to the first embodiment is a silicon photonic chip, as described above, the occupied area (pattern density) of the optical waveguides OT1 and OT2 relative to the semiconductor chip SC1 is low and is about 5% to 10% when combined with the light modulator PC, etc. Therefore, the region C in which the capacitor DC1 can be formed in the semiconductor chip SC1 can be sufficiently secured. Specifically, in plan view, when the area occupied by the capacitor DC1 with respect to the semiconductor chip SC1 having an area of 1 $mm^2$ is 30% and the insulating film IF is a silicon oxide film having a thickness of 10 nm, the capacitance of the capacitor DC1 is 1 nF. As described above, in the first embodiment, the capacitor DC1 having a sufficient capacitance as the capacitor for the noise filter can be incorporated in the semiconductor chip SC1.

The semiconductor layer SLa is disposed between the contact plugs PL1a and the insulating layer CL, but the semiconductor layer SLb is not disposed between the contact plugs PL1a and the insulating layer CL. The semiconductor layer SLb is disposed between the contact plugs PL1b and the insulating layer CL, but the semiconductor layer SLa is not disposed between the contact plugs PL1b and the insulating layer CL. Thus, for example, when the contact hole CT1a, CT1b is formed by plasma-etching, the thin insulating film IF between the semiconductor layer SLa and the semiconductor layer SLb is damaged or destroyed by charge-up, thereby preventing the semiconductor layer SLa and the semiconductor layer SLb from being short-circuited with each other.

In the first embodiment, of the external terminals of the semiconductor chip SC2, the terminal for supplying the ground potential to the driver IC is electrically connected with the wiring M2a of the semiconductor chip SC1 shown in FIG. 2, and the terminal for supplying the power supply potential to the driver IC is electrically connected with the wiring M2b of the semiconductor chip SC1 shown in FIG. 2. In this manner, the distance between the capacitor DC1 and the terminal for supplying the power supply potential and the terminal for supplying the ground potential of the driver IC can be about the thickness of the semiconductor chip SC1. Therefore, in the first embodiment, the connection distance between the semiconductor chip SC2 having the driver IC and the capacitor DC1 can be shortened as compared with the case where the capacitor is externally attached and connected with the driver IC via the wiring in the semiconductor chip as in the above-mentioned examination example. As a result, in the first embodiment, the parasitic resistance and the parasitic inductance of the capacitor DC1 are reduced as compared with the above-mentioned examination example, and noise can be removed in the high-frequency band.

Although not shown, the terminal for supplying the power supply potential to the driver IC and the terminal for supplying the ground potential to the driver IC are often formed at corners of the semiconductor chip SC2 shown in FIG. 1. Therefore, from the viewpoint of reducing the parasitic resistance and parasitic inductance by shortening the distance between the capacitor DC1 and the terminal for supplying the power supply potential and the terminal for supplying the ground potential of the driver IC as much as possible, it is preferable that the region C of the semiconductor chip SC1 in which the capacitor DC1 is formed is formed at a position overlapping the corner of the semiconductor chip SC2 having the driver IC in plan view.

As shown in FIG. 2, the semiconductor layer SLa constituting the capacitor DC1 is formed in the same layer as the optical waveguide OT1 of the semiconductor chip SC1. Therefore, in the step of forming the optical waveguide OT1 by processing the semiconductor layer SL, the semiconductor layer SLa can be formed at the same time. As a result, even if the capacitor DC1 is incorporated in the semiconductor chip SC1, an increase in the number of steps can be suppressed, and the manufacturing cost can be reduced accordingly.

In the first embodiment, the case where the first conductor film SLa and the second conductor film SLb are configured as the semiconductor layer SLa and the semiconductor layer SLb made of silicon has been described as an example, but may be configured of, for example, a metal material. However, when the first conductor film SLa and the second conductor film SLb are formed of a metal material, the surface thereof is rougher than that when the first conductor film SLa and the second conductor film SLb are formed of silicon, and discharge easily occurs between the first conductor film SLa and the second conductor film SLb. In order to prevent this, it is necessary to increase the thickness of the insulating film IF between the first conductor film SLa and the second conductor film SLb to secure the electrostatic withstand voltage between the first conductor film SLa and the second conductor film SLb, but if this occurs, the distance between the first conductor film SLa and the second conductor film SLb increases and the capacitance of the capacitor DC1 decreases. Therefore, it is advantageous that the first conductor film SLa and the second conductor film SLb are formed of silicon, rather than the first conductor film SLa and the second conductor film SLb formed of a metal material, in that the thickness of the insulating film IF can be reduced to increase the capacitance of the capacitor DC1.

In addition, when the insulating film IF is formed of a silicon oxide film, it is advantageous compared to the case where the insulating film IF formed of another material in that the dielectric constant of the insulating film IF is relatively high and the capacitance of the capacitor DC1 can be increased, and in that it is not necessary to remove the insulating film IF other than the portion of the capacitor DC1 because the insulating film IF is formed of the same material as the interlayer insulating film ID1. Further, when the insulating film IF is formed of a silicon nitride film, the electrostatic breakdown voltage performance of the insulating film IF can be improved, which is advantageous compared to the case where the insulating film IF is formed of another material. In addition, when the insulating film IF is formed of a stacked film of a silicon oxide film and a silicon nitride film, it is advantageous in that it has both the advantages of the silicon oxide film and the advantages of the silicon nitride film, as compared with the case where the insulating film IF is formed of only a silicon oxide film a silicon nitride film. However, when the insulating film IF is formed of only a silicon oxide film or a silicon nitride film, the number of manufacturing steps can be reduced, which is advantageous compared to the case where the insulating film IF is formed of the above-mentioned stacked film.

In addition, although the case where the conductivity types of the semiconductor layer SLa and the semiconductor layer SLb are each n-type has been described as an example, either one of them may be p-type or both may be p-type. However, when the conductivity type of the semiconductor layers SLa and SLb is n-type, the mobility of carriers is higher than that when the conductivity type is p-type, so that the resistance values of the semiconductor layers SLa and SLb can be effectively lowered. Therefore, the conductivity types of the semiconductor layers SLa and SLb are preferably n-type.

Although the semiconductor layer SLb is disposed between the contact plug PL1b and the insulating layer CL, but the semiconductor layer SLa is not disposed, the present invention is not limited thereto, and the contact plug PL1b and the semiconductor layer SLb may be in contact with each other, for example, in an area where the semiconductor layer SLa, the insulating film IF, and the semiconductor layer SLb are stacked. However, when such a configuration is employed, there is a possibility that the semiconductor layer SLb and the insulating film IF penetrate to reach the semiconductor layer SLa when the contact hole CT1b is opened. In this case, the contact plugs PL1b are electrically connected with the semiconductor layer SLa, and the capacitor DC1 does not function. In order to prevent such situation, for example, there is a method of increasing the thickness of the insulating film IF, but in this method, the distance between the semiconductor layer SLa and the semiconductor layer SLb is increased by an amount corresponding to the increase in the thickness of the insulating film IF, and the capacitance of the capacitor DC1 is reduced. From the above, it is preferable to adopt a configuration in which the semiconductor layer SLb is disposed between the contact plug PL1b and the insulating layer CL in the area where the contact plug PL1b and the semiconductor layer SLb are in contact with each other, but the semiconductor layer SLa is not disposed in the area where the contact plug PL1b and the semiconductor layer SLb are in contact with each other.

Figure 10:
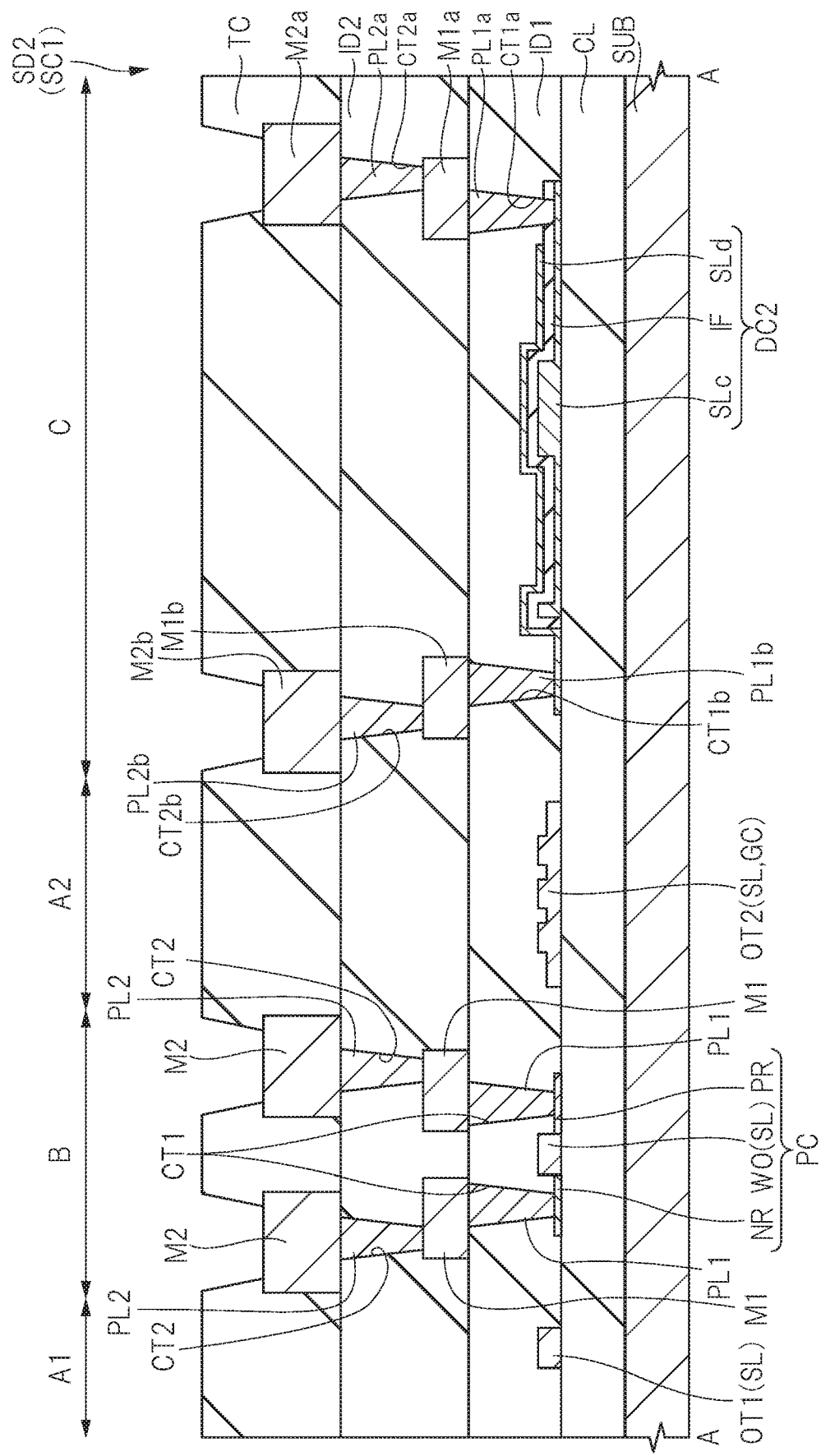
FIG. 10 is a cross-sectional view of a main portion of a semiconductor device according to a second embodiment.

Hereinafter, a semiconductor device according to second embodiment will be described. FIG. 10 is a cross-sectional view of a main portion showing the semiconductor device SD2 according to the second embodiment.

As shown in FIG. 10, the semiconductor chip SC1 comprising the semiconductor device SD2 of the second embodiment includes a capacitor DC2. That is, the capacitor DC2 is formed by the semiconductor layer (the first conductor film) SLc formed in the interlayer insulation film ID1 of the semiconductor chip SC1, the insulating film IF, and the semiconductor layer (the second conductor film) SLd. The semiconductor layer SLc is formed as a dummy pattern for forming the optical modulator PC, for example. Therefore, the thick portion of the semiconductor layer SLc is the same as the thickness of the optical waveguide WO, and the thin portion of the semiconductor layer SLc is the same as the thicknesses of the semiconductor layer PR and the semiconductor layer NR. The thickness of the insulating film IF disposed between the semiconductor layer SLc and the semiconductor layer SLd is constant. That is, the distance between the upper surface of the semiconductor layer SLc and the lower surface of the semiconductor layer SLd is constant.

The above point is a difference between the semiconductor device SD2 of the second embodiment and the semiconductor device SD1 according to the first embodiment. The other configuration of the semiconductor device SD2 according to the second embodiment is the same as the configuration of the semiconductor device SD1 according to the first embodiment, and therefore a repetitive description thereof is omitted.

Next, a manufacturing method of the semiconductor device SD2 according to the second embodiment will be described in order of steps with reference to FIGS. 11 to 18. FIGS. 11 to 18 are cross-sectional views of main portions during the manufacturing step of the semiconductor device SD2 according to the second embodiment. In order to simplify the understanding, only the regions A1, B, and C of the semiconductor chip SC1 shown in FIG. 10 are shown in FIGS. 11 to 18.

Figure 11:
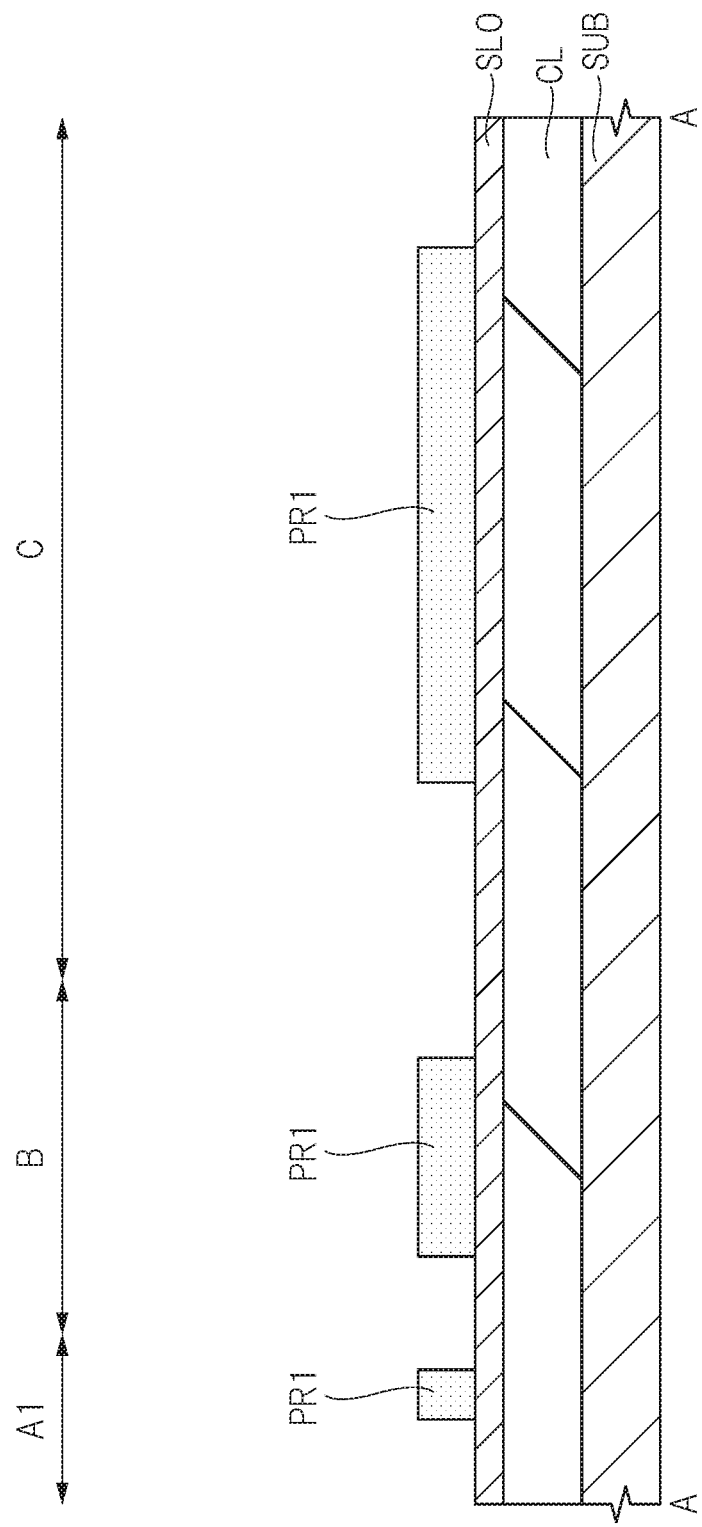
FIG. 11 is a cross-sectional view of a main portion illustrating a manufacturing step of a semiconductor device according to a second embodiment.
Figure 12:
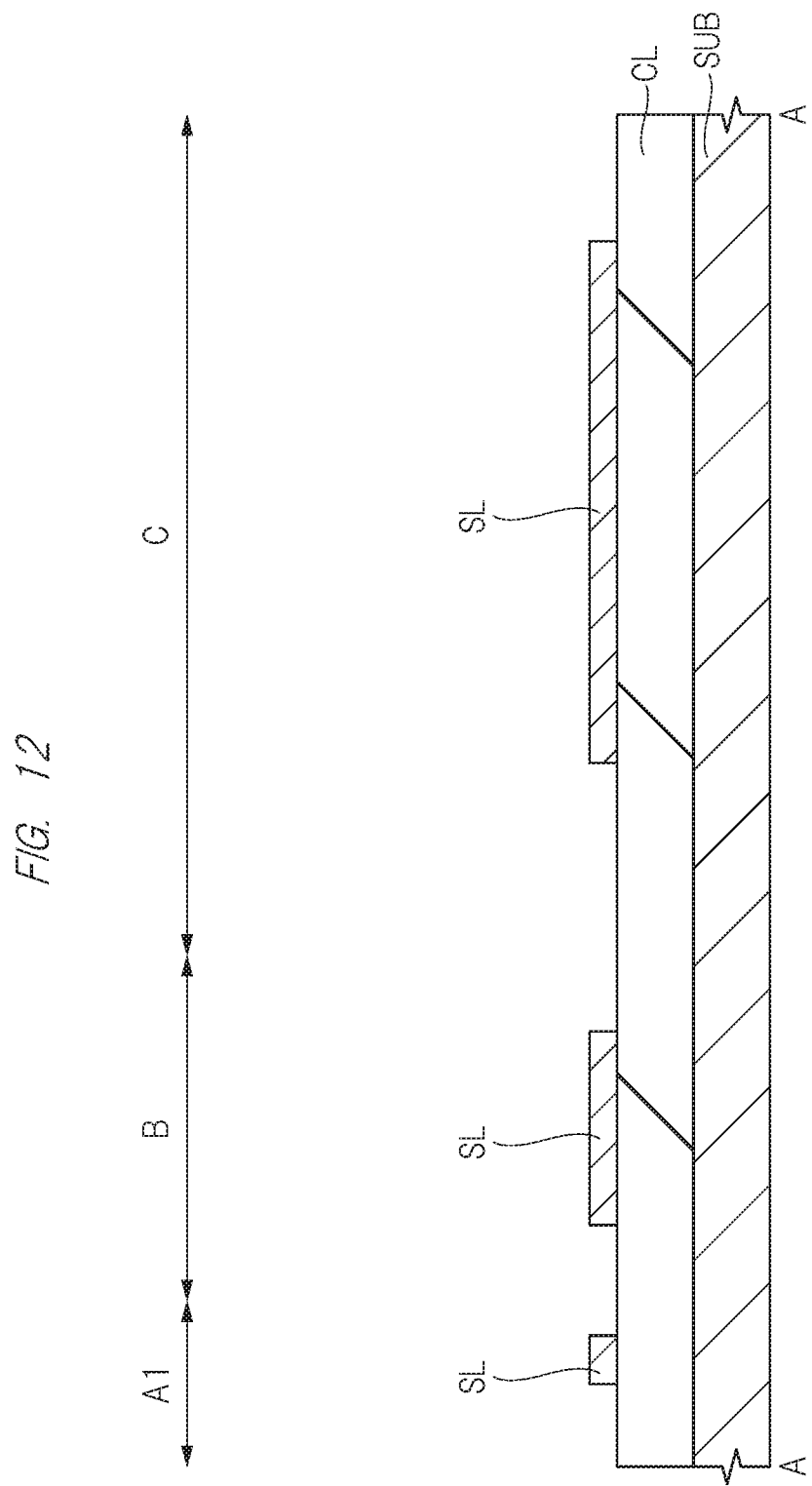
FIG. 12 is a cross-sectional view of a main portion illustrating a manufacturing step of a semiconductor device according to a second embodiment after the step in FIG. 11.

First, as shown in FIG. 11, an SOI substrate composed of a substrate SUB, an insulating layer CL, and a semiconductor layer SL is prepared. Next, the semiconductor layer SLO is patterned by dry etching using the photoresist film PR1 formed on the semiconductor layer SLO made of silicon as a mask, thereby forming the semiconductor layer SL on a part of the SOI substrate as shown in FIG. 12.

Figure 13:
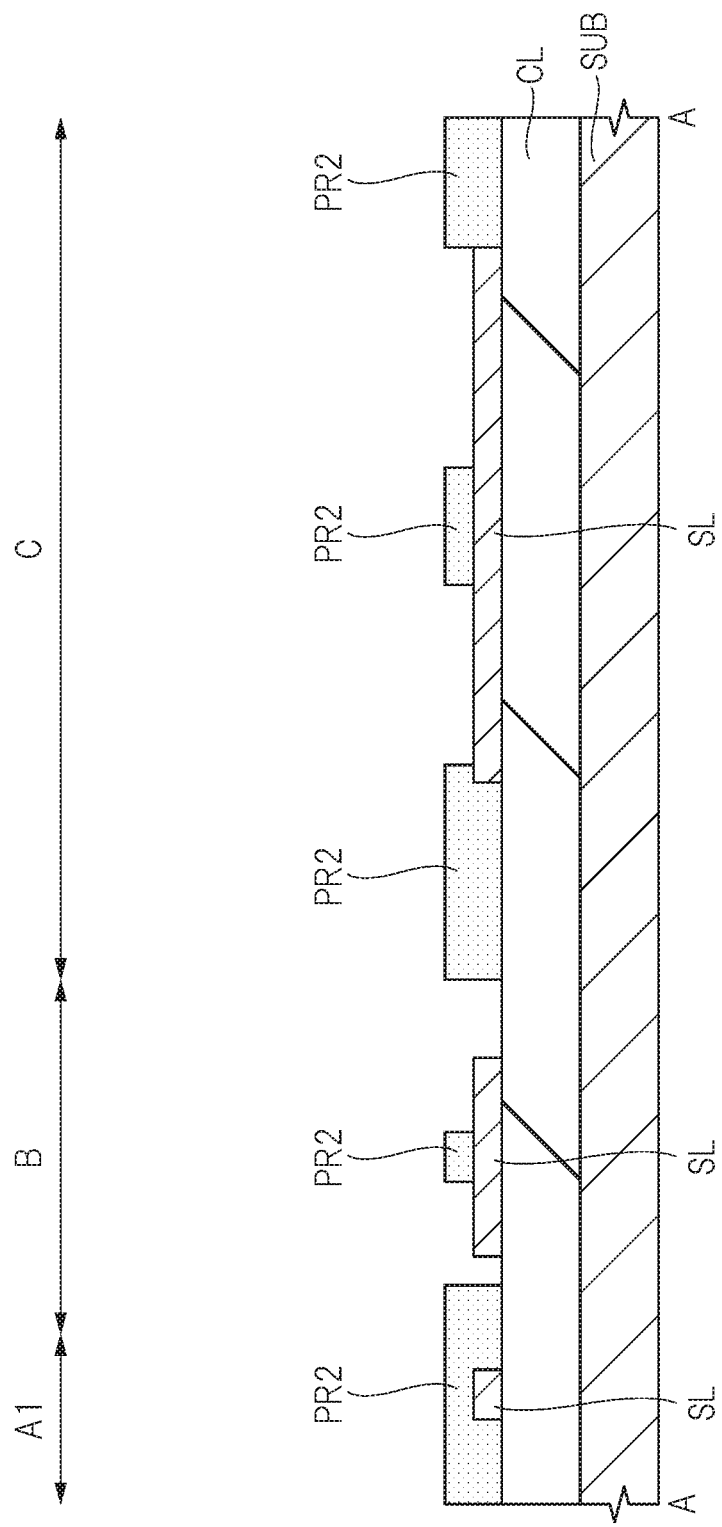
FIG. 13 is a cross-sectional view of a main portion illustrating a manufacturing step of a semiconductor device according to a second embodiment after the step in FIG. 12.
Figure 14:
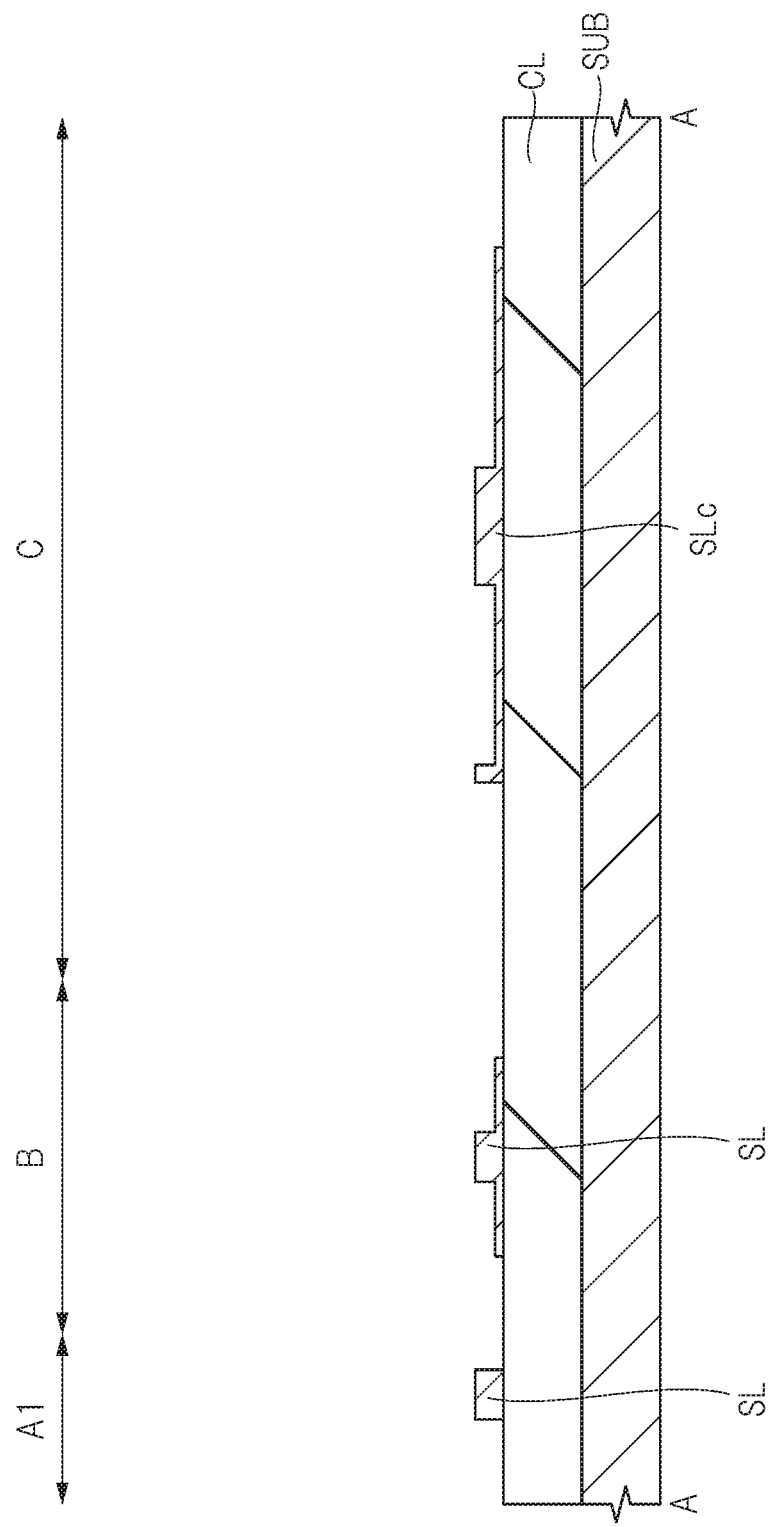
FIG. 14 is a cross-sectional view of a main portion illustrating a manufacturing step of a semiconductor device according to a second embodiment after the step in FIG. 13.

Next, as shown in FIG. 13, the semiconductor layer SL is patterned in regions B and C by dry etching with the photoresist film PR2 formed on the insulating layer CL and the semiconductor layer SL masked, as shown in FIG. 14. As described above, the semiconductor layer SL in the region C is a dummy pattern for patterning the semiconductor layer SL in the region B. Thereafter, an n-type impurity is introduced into the patterned semiconductor layer SL in the region C by ion implantation using, for example, a photoresist film as a mask, thereby forming semiconductor layer SLc.

Figure 15:
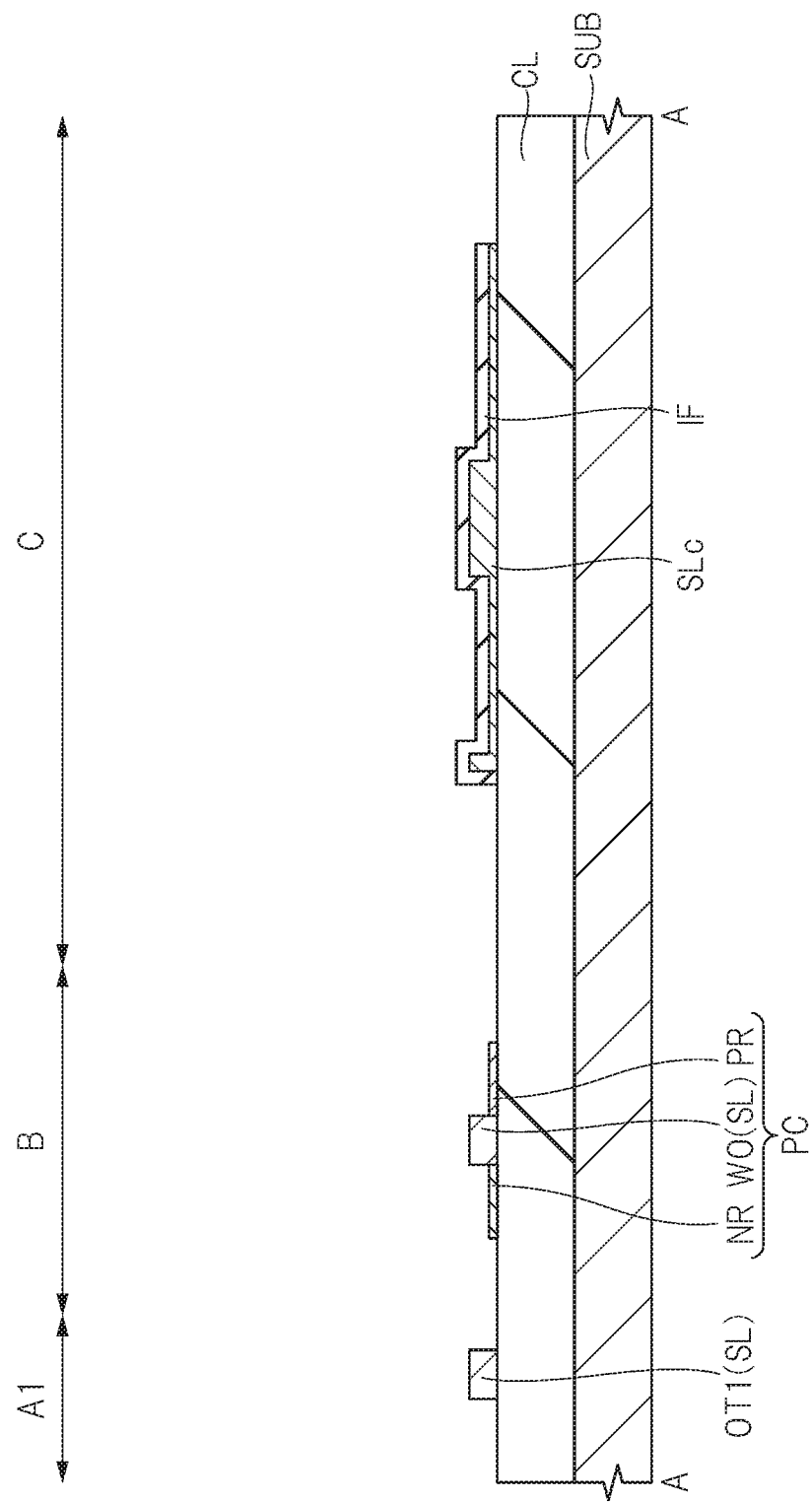
FIG. 15 is a cross-sectional view of a main portion illustrating a manufacturing step of a semiconductor device according to a second embodiment after the step in FIG. 14.

Further, for example, an n-type impurity having a $1\times10^{17}$ $cm^{-3}$ or more is introduced into a part of the semiconductor layer SL in the area B by an ion implantation method using a photo-resist film (not shown) as a mask, whereby the semiconductor layer NR shown in FIG. 15 is formed. Similarly, a p-type impurity having a $1\times10^{17}$ $cm^3$ or more is introduced into a part of the semiconductor layer SL in the area B to form the semiconductor layer PR shown in FIG. 15. The portion of the semiconductor layer SL in the region B into which the n-type impurity and the p-type impurity are not introduced becomes the optical waveguide WO. Thus, an optical modulator PC including the optical waveguide WO, the semiconductor layer NR, and the semiconductor layer PR is formed. Thereafter, an insulating film IF is formed on the insulating layer CL so as to cover the semiconductor layer SLc.

Figure 16:
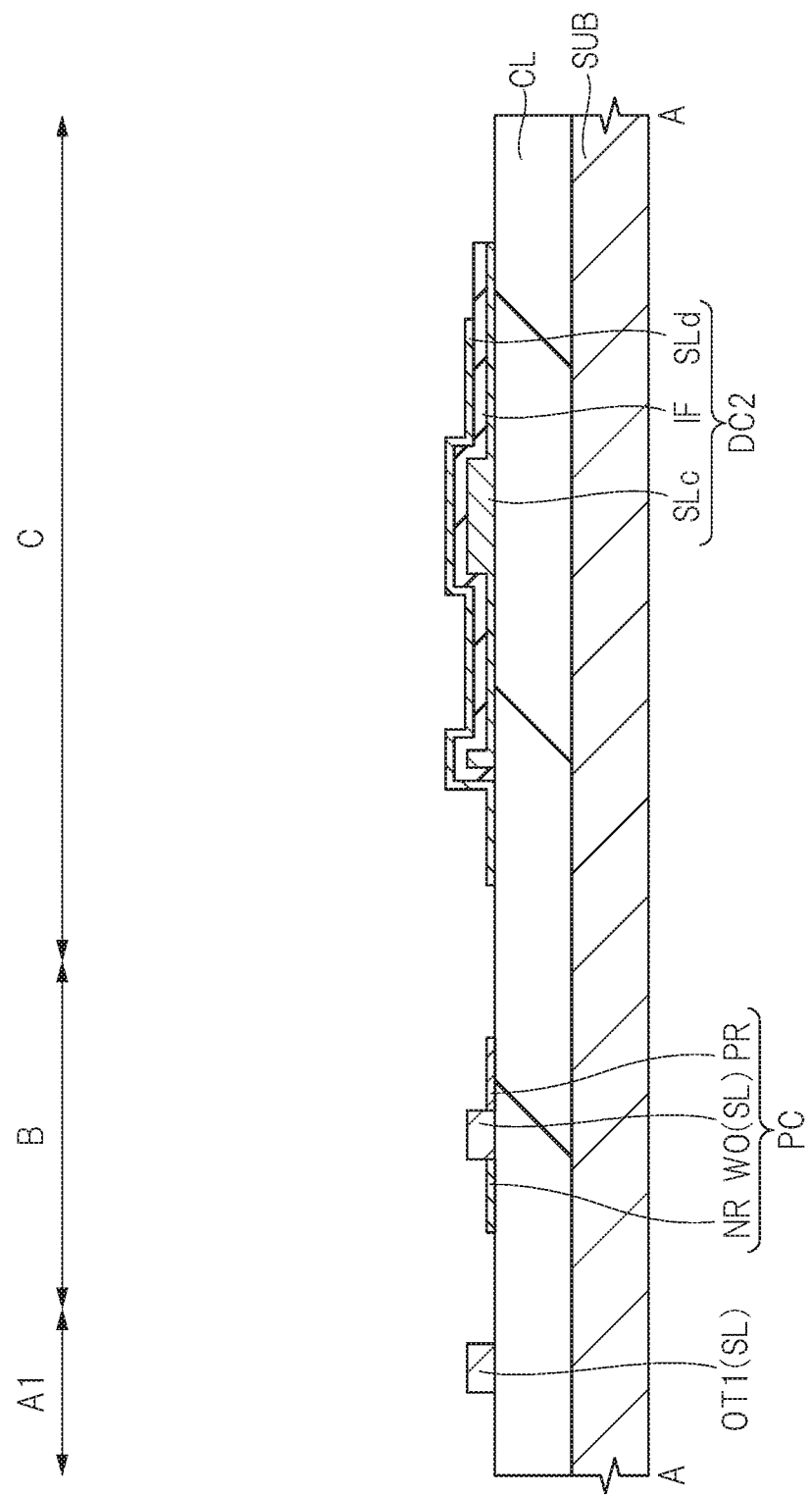
FIG. 16 is a cross-sectional view of a main portion illustrating a manufacturing step of a semiconductor device according to a second embodiment after the step in FIG. 15.

Next, as shown in FIG. 16, a semiconductor layer SLd made of a polycrystalline silicon film containing an n-type impurity is formed on the insulating layer CL by, e.g., CVD so as to cover the insulating film IF. As a result, a capacitor DC2 composed of an n-type semiconductor layer (first conductor film) SLc, an insulating film IF, and an n-type semiconductor layer (second conductor film) SLd is formed.

Figure 17:
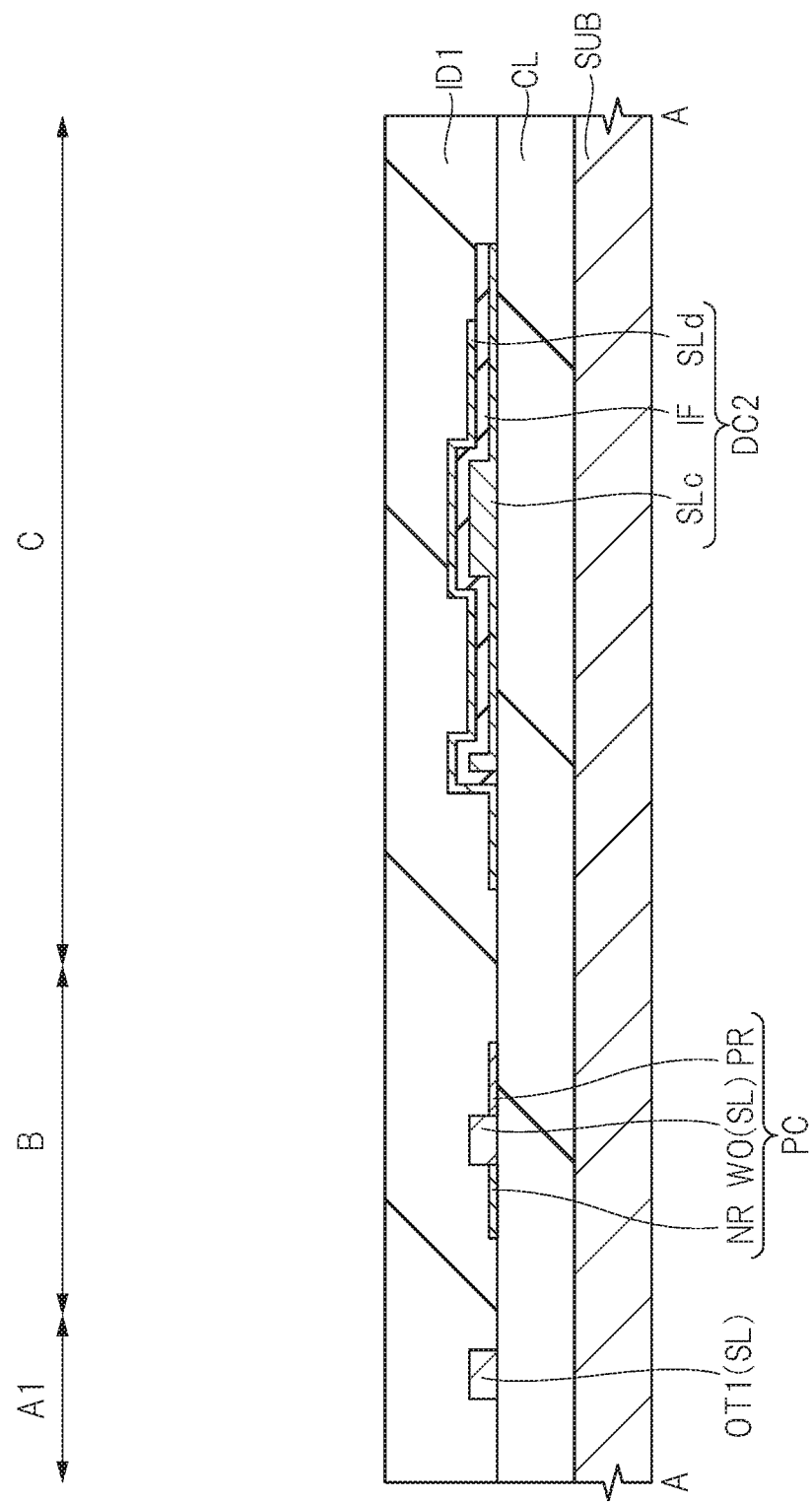
FIG. 17 is a cross-sectional view of a main portion illustrating a manufacturing step of a semiconductor device according to a second embodiment after the step in FIG. 16.

Next, as shown in FIG. 17, an interlayer insulating film ID1 made of a silicon oxide film is deposited on the insulating layer CL so as to cover the capacitor DC2 by, e.g., CVD. Thereafter, the upper surface of the interlayer insulating film ID1 is flattened by, e.g., CMP.

Figure 18:
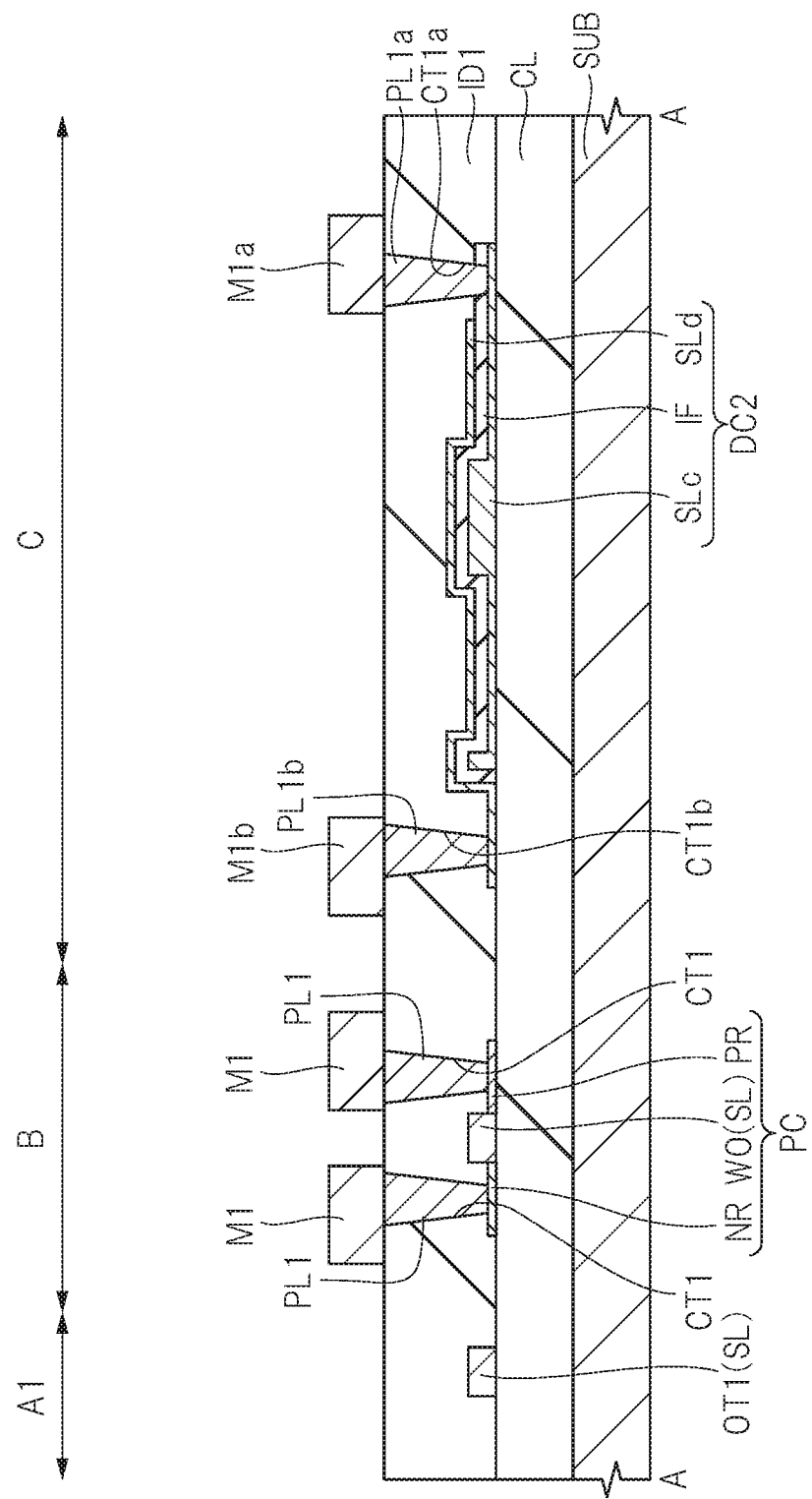
FIG. 18 is a cross-sectional view of a main portion illustrating a manufacturing step of a semiconductor device according to a second embodiment after the step in FIG. 17.

Next, as shown in FIG. 18, a contact hole CT1a reaching the semiconductor layer SLc and a contact hole CT1b reaching the semiconductor layer SLd are formed in the interlayer insulating film ID1 and the insulating film IF. Then, a tungsten film, for example, is buried in each of the contact holes CT1a, CT1b to form contact plugs PL1a, PL1b. Thereafter, an aluminum film is deposited on the upper surface of the interlayer insulating film ID1 by, e.g., sputtering. The aluminum film is processed by a dry etching method to form wirings M1a and M1b.

Since the steps from FIG. 18 to the completion of the semiconductor chip SC1 of the second embodiment are the same as the steps from FIG. 8 to the completion of the semiconductor chip SC1 of the first embodiment described above, a repetitive description thereof will be omitted. Further, since the semiconductor chip SC1 according to the second embodiment is completed, the process from the completion of the semiconductor device SD2 to the completion of the semiconductor device SD2 is the same as the process from the completion of the semiconductor chip SC1 according to the first embodiment to the completion of the semiconductor device SD1 according to the second embodiment, and therefore, the description of the repeated steps is omitted.

Hereinafter, features and effects of the semiconductor device SD2 of the second embodiment will be described.

As described above, the optical waveguide, including those included in the optical modulator, is formed by patterning the semiconductor layer by, for example, dry etching. Here, when the pattern density of the optical waveguide with respect to the semiconductor chip is low in plan view, variations occur in the size and shape of the optical waveguide to be patterned. Therefore, when the optical waveguide OT1 and the like are formed on the semiconductor chip SC1, a dummy pattern is arranged in a region where the optical waveguide OT1 and the like are not formed to increase the pattern density, thereby suppressing variations in the size and shape of the optical waveguide OT1 and the like. However, this dummy pattern was not used for any other purpose.

Therefore, in the second embodiment, for example, the capacitor DC2 is formed using a dummy pattern for forming the optical modulator PC. Thus, in the second embodiment, it is unnecessary to separately form the semiconductor layer SLa as in the first embodiment, and the manufacturing cost can be reduced.

On the other hand, in the first embodiment, since the semiconductor layer SLa is formed separately from the dummy pattern, the planar shape and thickness of the semiconductor layer SLa can be arbitrarily controlled. In this respect, the first embodiment is advantageous over the second embodiment.

Although the semiconductor layer SLc of the second embodiment has been described as an example of a dummy pattern for forming the optical modulator PC, the semiconductor layer SLc may be a dummy pattern for forming the optical waveguide OT2, for example.

Figure 19:
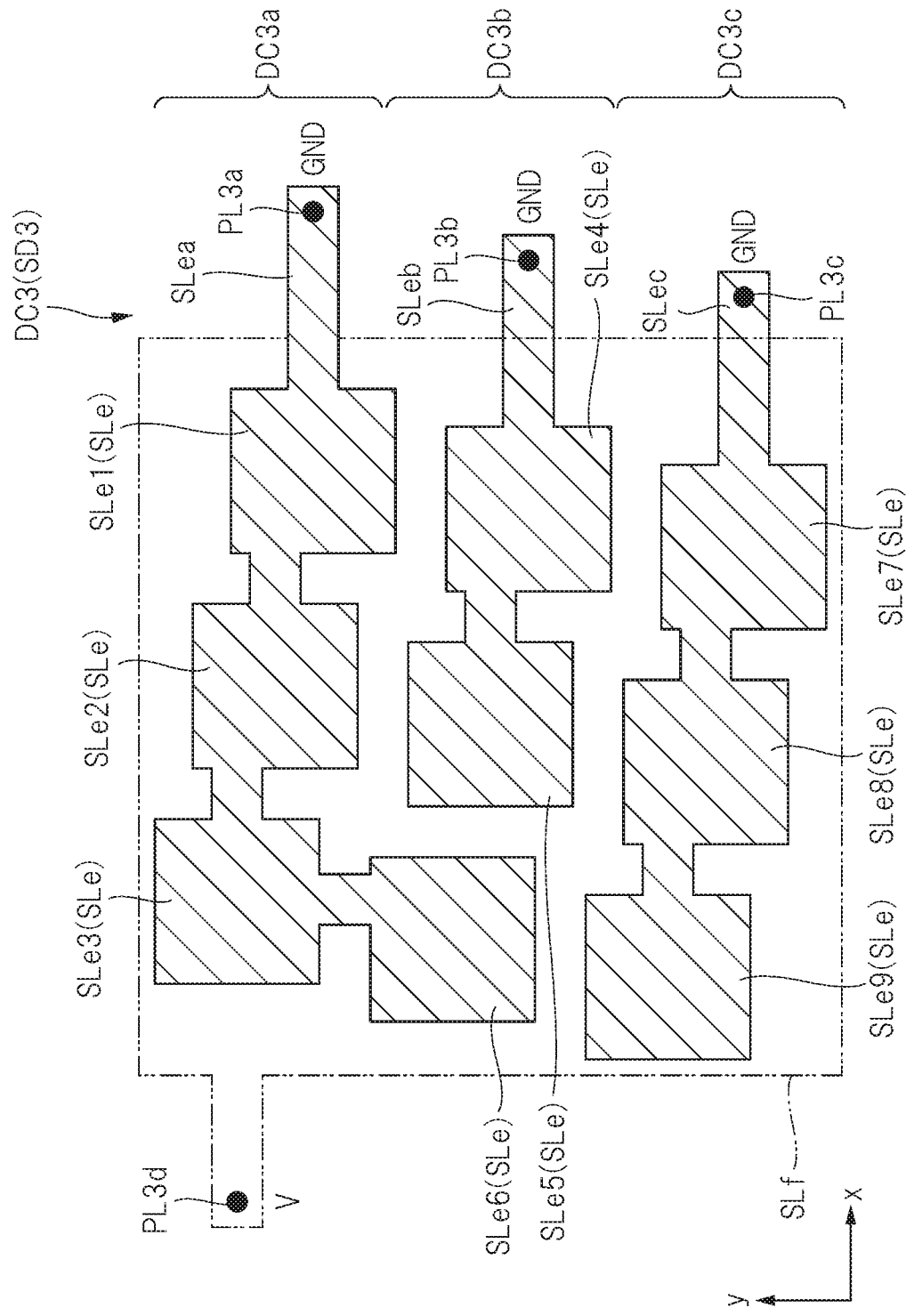
FIG. 19 is r plan view illustrating a main portion of a semiconductor device according to a third embodiment.

Hereinafter, a semiconductor device according to a third embodiment will be described. FIG. 19 is a plan view illustrating a capacitor DC3 of a semiconductor device SD3 according to the third embodiment.

Although not shown, the semiconductor chip SC1 comprising the semiconductor device SD3 of the third embodiment includes a capacitor DC3. That is, the capacitor DC3 is formed by the semiconductor layer (the first conductor film) SLe formed in the interlayer insulation film ID1 of the semiconductor chip SC1, the insulating film IF, and the semiconductor layer (the second conductor film) SLf. However, as will be described later, the semiconductor layers SLe1, SLe2, SLe3, SLe6, the insulating film IF, and the semiconductor layer SLf constitute a capacitor DC3a. The semiconductor layers SLe4, SLe5, the insulating film IF, and the semiconductor layer SLf constitute a capacitor DC3b. The semiconductor layers SLe7, SLe8, SLe9, the insulating film IF, and the semiconductor layer SLf constitute a capacitor DC3c. That is, the capacitor DC3 is composed of three capacitors DC3a, DC3b, DC3c.

Next, the planar structure of the capacitor DC3 will be described in detail. In FIG. 19, in order to simplify understanding, the semiconductor layer SLf represented by a two-dot chain line, and the semiconductor layer SLa overlapping with the semiconductor layer SLb in a plan view is represented by a perspective view.

As shown in FIG. 3, the semiconductor layer SLe includes a semiconductor layers SLe1, SLe2, SLe3, SLe4, SLe5, SLe6, SLe7, SLe8, SLe9. The semiconductor layers SLe1, SLe2, SLe6 are electrically connected with each other. The semiconductor layers SLe4, SLe5 are electrically connected with each other. The semiconductor layers SLe7, SLe8, SLe9 are electrically connected with each other. However, in the third embodiment, unlike the first embodiment, the semiconductor layer SLe1, SLe2, SLe3, SLe6 is not electrically connected with the semiconductor layers SLe4, SLe5, SLe7, SLe8, SLe9. The semiconductor layers SLe4, SLe5 is not electrically connected with the SLe7, SLe8, SLe9. The semiconductor layers SLe1, SLe2, SLe3, SLe4, SLe5, SLe6, SLe7, SLe8, SLe9 is a square pattern having a side of, for example, 1 μm to 50 μm in plan view.

On the other hand, the semiconductor layer SLf is formed so as to cover the semiconductor layers SLe1, SLe2, SLe3, SLe4, SLe5, SLe6, SLe7, SLe8, SLe9 in plan view. The semiconductor layer SLf is a square pattern having a side of, for example, 5 to 200 μm in plan view.

The semiconductor layer SLea electrically connected with the semiconductor layers SLe1, SLe2, SLe3, SLe6 is in contact with the contact plugs PL3a. The semiconductor layer SLeb electrically connected with the semiconductor layers SLe4, SLe5 is in contact with the contact plugs PL3b. The semiconductor layer SLec electrically connected with the semiconductor layers SLe7, SLe8, SLe9 is in contact with the contact plugs PL3c. The semiconductor layer SLf is in contact with the contact plugs PL3d.

In plan view, the semiconductor layer SLe and the semiconductor layer SLf do not overlap each other in a region where the semiconductor layer SLea and the contact plug PL3a are in contact with each other, a region where the semiconductor layer SLeb and the contact plug PL3b are in contact with each other, and a region where the semiconductor layer SLec and the contact plug PL3c are in contact with each other. In plan view, the semiconductor layer SLe and the semiconductor layer SLf do not overlap each other in regions where the semiconductor layer SLf and the contact plugs PL3b are in contact with each other.

Although not shown, the contact plugs PL3a, PL3b, PL3c are electrically connected with the wiring M2a (see FIG. 2), and the contact plug PL3d is electrically connected with the wiring M2b (see FIG. 2). Therefore, the line M2a is connected with the ground potential, for example, so that the ground potential GND in FIG. 19 is supplied to the semiconductor layers SLea, SL3b, SLec. Similarly, the wiring M2b is connected with the power supply potential, for example, so that the power supply potential V in FIG. 19 is supplied to the semiconductor layer SLf.

The above point is the difference between the semiconductor device SD3 of the third embodiment and the semiconductor device SD1 of the first embodiment. The other configuration of the semiconductor device SD3 of the third embodiment is the same as the configuration of the semiconductor device SD1 of the first embodiment, and therefore a repetitive description thereof is omitted.

Hereinafter, features and effects of the semiconductor device SD3 of the third embodiment will be described.

As described above, it is necessary to prepare a plurality of noise filters composed of a combination of a plurality of capacitors having different capacitances in accordance with the number and arrangement of the power supply lines. Therefore, in the third embodiment, unlike the first embodiment, the semiconductor layer SLe is formed of a plurality of patterns SLe1, SLe2, SLe3, SLe4, SLe5, SLe6, SLe7, SLe8, SLe9. The capacitor DC3 is separated into three capacitors DC3a, DC3b, DC3c by electrically separating the semiconductor layers SLe1, SLe2, SLe3, SLe6, the semiconductor layers SLe4, SLe5, and the semiconductor layers SLe7, SLe8, SLe9. Thus, in third embodiment, the capacitance of the capacitor can be easily adjusted. Particularly, the semiconductor layers SLe1, SLe2, SLe3, SLe6, the semiconductor layers SLe4, SLe5, and the semiconductor layers SLe7, SLe8, SLe9 are electrically separated from each other, whereby the capacitors DC3a, DC3b, DC3c can be separated from each other by differing capacitances.

In the third embodiment, the case where the capacitance of the capacitor is adjusted by electrically isolating the semiconductor layer from several semiconductor layers has been described as an example, but the present invention is not limited to this. For example, the capacitance of the capacitor can be adjusted by changing the pattern shape or the area of the semiconductor layer in plan view. For example, in the case of a square semiconductor layer, the size can be adjusted in the range of 1 to 200 μm on one side. Further, for example, in plan view, the square-shaped semiconductor layer SLe1 may be further divided into four regions having an area of ¼, and contact plugs may be connected with the respective regions.

The third embodiment can also be combined with the second embodiment. That is, the capacitance of the capacitor can be adjusted by changing the shape and area of the dummy pattern by dividing or the like.

The planar configuration of the semiconductor layers SLe1, SLe2, SLe3, SLe4, SLe5, SLe6, SLe7, SLe8, SLe9 are not limited to a square, and the arrangement of the semiconductor layers SLe1, SLe2, SLe3, SLe4, SLe5, SLe6, SLe7, SLe8, SLe9 are not limited to the oblique arrangement shown in FIG. 19.

Although the invention made by the present inventor has been specifically described based on the embodiment, the present invention is not limited to the embodiment described above, and it is needless to say that various modifications can be made without departing from the gist thereof.

What is claimed is:

1. A semiconductor device comprising:
   a substrate;
   an optical waveguide formed on the substrate;
   a first conductor film formed in the same layer as the optical waveguide;
   an insulating film formed on the first conductor film;
   a second conductor film formed on the insulating film;
   a first interlayer insulating film formed on the substrate such that the first interlayer insulating film covers the optical waveguide, the first conductor film, the insulating film and the second conductor film;
   a first contact plug formed in the first interlayer insulating film and reaching the first conductor film such that the first conductor film is disposed between the first contact plug and the substrate without the second conductor film and the insulating film being disposed between the first contact plug and the substrate; and
   a second contact plug formed in the first interlayer insulating film and reaching the second conductor film,
   wherein the first and second conductor films are not electrically connected with each other, and
   wherein a capacitor is constituted with the first conductor film, the insulating film, and the second conductor film.

2. The semiconductor device according to claim 1, wherein the second conductor film is disposed between the second contact plug and the substrate without the first conductor film being disposed between the second contact plug and the substrate.

3. The semiconductor device according to claim 1,
   wherein the first conductor film is formed of a first semiconductor film containing a first impurity of a first conducting type, and
   wherein the second conductor film is formed of a second semiconductor film containing a second impurity of the first conducting type.

4. The semiconductor device according to claim 3, wherein the first conductive type is n type.

5. The semiconductor device according to claim 3, wherein a concentration of the first impurity in the first semiconductor film and a concentration of the second impurity in the second semiconductor film are each $1 \times 10^{18}$ cm$^{-3}$ or more.

6. The semiconductor device according to claim 3, wherein the first conductor film is spaced from the optical waveguide.

7. The semiconductor device according to claim 1, wherein the capacitor is formed in a region where the optical waveguide is not formed in plan view.

8. The semiconductor device according to claim 1, comprising a first semiconductor chip and a second semiconductor chip mounted on the first semiconductor chip,
   wherein the optical waveguide, the capacitor, and an optical modulator are formed in the first semiconductor chip, the optical modulator modulating light propagating in the optical waveguide,
   wherein a driver IC operating the optical modulator is formed in the second semiconductor chip, and
   wherein the capacitor is electrically connected with a first terminal providing the driver IC with power potential and a second terminal providing the driver IC with ground potential in parallel.

9. The semiconductor device according to claim 1, wherein the insulating film is formed of a silicon oxide film.

10. The semiconductor device according to claim 1, wherein the insulating film is formed of a silicon nitride film.

11. The semiconductor device according to claim 1, wherein the insulating film is formed of a laminated film comprising:
    a first silicon oxide film;
    a silicon nitride film formed on the first silicon oxide film; and
    a second silicon oxide film formed on the silicon nitride film.

12. A semiconductor device comprising:
    a substrate;
    an optical waveguide formed on the substrate;
    a plurality of first conductor films formed in the same layer as the optical waveguide;
    an insulating film formed on the plurality of first conductor films;
    a second conductor film formed on the insulating film;
    a first interlayer insulating film formed on the substrate such that the first interlayer insulating film covers the optical waveguide, the plurality of first conductor films, the insulating film, and the second conductor film;
    a plurality of first contact plugs formed in the first interlayer insulating film and reaching the plurality of first conductor films, respectively, such that the plurality of first conductor films is disposed between the plurality of first contact plugs and the substrate without the second conductor film and the insulating film being disposed between the plurality of first contact plugs and the substrate; and
    a second contact plug formed in the first interlayer insulating film and reaching the second conductor film, wherein the plurality of first conductor films is not electrically connected with each other,
wherein the plurality of first conductor films and the second conductor film are not electrically connected with each other, and
wherein a plurality of capacitors is respectively constituted with each of the plurality of first conductor films, the insulating film, and the second conductor film.

13. The semiconductor device according to claim 12, wherein the plurality of capacitors is formed in a region where the optical waveguide is not formed in plan view.

14. The semiconductor device according to claim 12,
wherein the second conductor film is disposed between the second contact plug and the substrate, and
wherein each of the plurality of first conductor films is not disposed between the second contact plug and the substrate.

15. The semiconductor device according to claim 12,
wherein the plurality of first conductor films is formed of a plurality of first semiconductor films containing a first impurity of a first conducting type, and
wherein the second conductor film is formed of a second semiconductor film containing a second impurity of the first conducting type.

16. The semiconductor device according to claim 15, wherein the first conductive type is n type.

17. The semiconductor device according to claim 15, wherein a concentration of the first impurity in the first semiconductor film and a concentration of the second impurity in the second semiconductor film are each $1 \times 10^{18}$ cm$^{-3}$ or more.

18. The semiconductor device according to claim 15, wherein the plurality of first conductor films is each spaced from the optical waveguide.

19. A semiconductor device comprising:
a substrate;
an optical waveguide formed on the substrate;
a first conductor film formed in the same layer as the optical waveguide;
an insulating film formed on the first conductor film;
a second conductor film formed on the insulating film;
a first interlayer insulating film formed on the substrate such that the first interlayer insulating film covers the optical waveguide, the first conductor film, the insulating film and the second conductor film;
a first contact plug formed in the first interlayer insulating film and reaching the first conductor film such that the first conductor film is disposed between the first contact plug and the substrate without the second conductor film and the insulating film being disposed between the first contact plug and the substrate; and
a second contact plug formed in the first interlayer insulating film and reaching the second conductor film,
wherein the first conductor film and the second conductor film are not electrically connected with each other, and
wherein the insulating film is formed of a laminated film comprising:
a first silicon oxide film;
a silicon nitride film formed on the first silicon oxide film; and
a second silicon oxide film formed on the silicon nitride film.

* * * * *